US012598796B2

(12) United States Patent
Yeong et al.

(10) Patent No.: US 12,598,796 B2
(45) Date of Patent: Apr. 7, 2026

(54) HIGH ASPECT RATIO GATE STRUCTURE FORMATION

(71) Applicant: Taiwan Semiconductor Manufacturing Co., Ltd., Hsin-Chu (TW)

(72) Inventors: Sai-Hooi Yeong, Hsinchu County (TW); Chi-On Chui, Hsinchu City (TW); Kai-Hsuan Lee, Hsinchu City (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,908

(22) Filed: Aug. 8, 2023

(65) Prior Publication Data

US 2023/0411494 A1     Dec. 21, 2023

Related U.S. Application Data

(63) Continuation of application No. 17/705,508, filed on Mar. 28, 2022, now Pat. No. 11,824,101, which is a
(Continued)

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/024* (2025.01); *H10D 30/62* (2025.01);
(Continued)

(58) Field of Classification Search
CPC ..... H01L 21/02697; H01L 21/28–2885; H01L 29/66545; H01L 21/823431;
(Continued)

(56) References Cited

U.S. PATENT DOCUMENTS 6,051,863 A     4/2000 Hause et al.
8,796,666 B1     8/2014 Huang et al.
(Continued)

FOREIGN PATENT DOCUMENTS

CN     106601683 A * 4/2017 ..... H01L 21/823821

*Primary Examiner* — Evan G Clinton
(74) *Attorney, Agent, or Firm* — HAYNES AND BOONE, LLP

(57) ABSTRACT

A method includes forming a fin over a substrate, forming an isolation structure on the substrate, and forming first and second mandrel patterns over the fin. The fin extends upwardly through the isolation structure. The fin extends lengthwise along a first direction, and each of the first and second mandrel patterns extends lengthwise along a second direction perpendicular to the first direction. The method also includes depositing a sacrificial feature between the first and second mandrel patterns, removing the first and second mandrel patterns, forming a spacer layer in physical contact with sidewalls of the sacrificial feature, removing the sacrificial feature to form a trench, and forming a metal gate stack in the trench. The sacrificial feature extends lengthwise along the second direction.

20 Claims, 29 Drawing Sheets

Related U.S. Application Data continuation of application No. 16/453,799, filed on Jun. 26, 2019, now Pat. No. 11,289,583.

(60) Provisional application No. 62/738,036, filed on Sep. 28, 2018.

(51) Int. Cl.

| | |
|---|---|
| *H10D 30/62* | (2025.01) |
| *H10D 84/01* | (2025.01) |
| *H10D 84/03* | (2025.01) |

(52) U.S. Cl.
CPC ..... *H10D 84/0147* (2025.01); *H10D 84/0158* (2025.01); *H10D 84/038* (2025.01)

(58) Field of Classification Search
CPC ....... H01L 21/823468; H01L 29/66795; H01L 29/785; H01L 27/0886
See application file for complete search history.

(56) References Cited

U.S. PATENT DOCUMENTS

| | | | |
|---|---|---|---|
| 8,815,712 | B2 | 8/2014 | Wan et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 8,963,258 | B2 | 2/2015 | Yu et al. |
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 2010/0006955 | A1 | 1/2010 | Takimoto |
| 2013/0285116 | A1 | 10/2013 | Lochtefeld et al. |
| 2016/0093537 | A1 | 3/2016 | Chen et al. |
| 2016/0190280 | A1 | 6/2016 | Young et al. |
| 2017/0054004 | A1 | 2/2017 | Cheng et al. |
| 2017/0092735 | A1* | 3/2017 | Hashemi ............. H10D 64/021 |
| 2017/0125593 | A1 | 5/2017 | Chang et al. |
| 2018/0102418 | A1* | 4/2018 | Bih ................... H01L 21/32137 |
| 2018/0175029 | A1 | 6/2018 | Ching et al. |
| 2019/0334004 | A1* | 10/2019 | Bi ................... H01L 21/823425 |
| 2019/0393345 | A1* | 12/2019 | Cheng .............. H01L 29/66545 |
| 2020/0027795 | A1 | 1/2020 | Sung et al. |

* cited by examiner

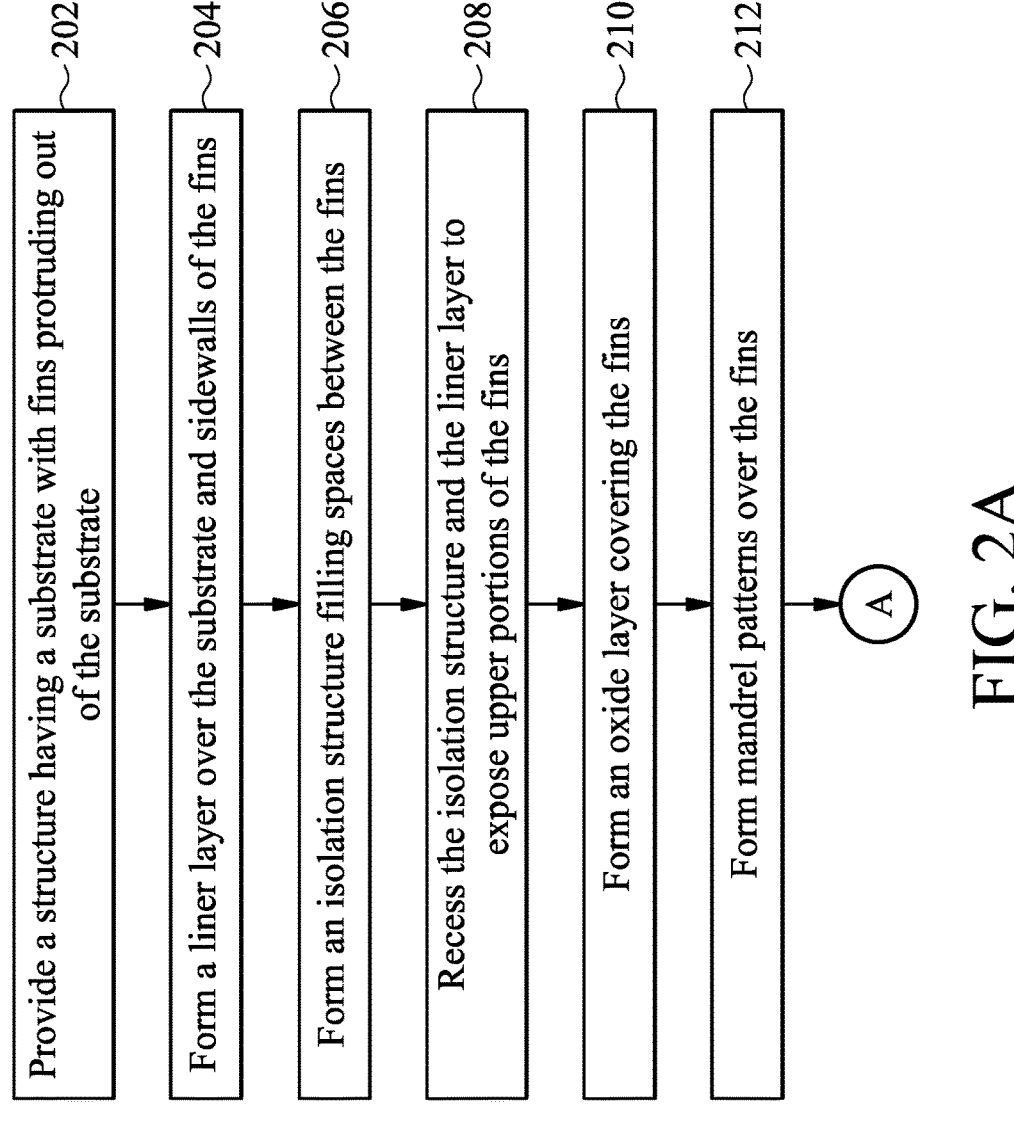

200

Provide a structure having a substrate with fins protruding out of the substrate ⌐202

Form a liner layer over the substrate and sidewalls of the fins ⌐204

Form an isolation structure filling spaces between the fins ⌐206

Recess the isolation structure and the liner layer to expose upper portions of the fins ⌐208

Form an oxide layer covering the fins ⌐210

Form mandrel patterns over the fins ⌐212

Form dummy gates in openings between the mandrel patterns — 214a

Remove the mandrel patterns — 214b

Form a spacer layer on sidewalls of the dummy gates — 214c

} 214

Form source/drain features, a contact etch stop layer, and an inter-layer dielectric (ILD) layer — 216

Replace the dummy gates with high-k metal gate stacks — 218

Perform further steps — 220

200

HIGH ASPECT RATIO GATE STRUCTURE FORMATION

PRIORITY

This is a continuation application of U.S. patent application Ser. No. 17/705,508, filed on Mar. 28, 2022, which is a continuation application of U.S. patent application Ser. No. 16/453,799, filed on Jun. 26, 2019, now issued U.S. Pat. No. 11,289,583, which claims priority to U.S. Provisional Patent Application Ser. No. 62/738,036 entitled "Gate Structures and Formation Methods Thereof," filed on Sep. 28, 2018, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, such as Field-Effect Transistors (FETs) designs, has been the replacement of a polysilicon gate with a metal gate to improve device performance with decreasing feature sizes. One process of forming a metal gate is termed a replacement gate or "gate-last" process in which the metal gate is fabricated "last" to replace an earlier formed dummy gate, which allows for a reduced number of subsequent processes. However, there are challenges to implementing such IC fabrication processes, especially with scaled down IC features in advanced process nodes. For example, as the scaling down continues, channel lengths of FETs decrease. Accompanying the decreasing in channel lengths, critical dimensions (CD) of gate structures deposited above channels of the FETs also decrease, often resulting in a high aspect ratio gate profile. A dummy gate with a high aspect ratio is more likely to collapse during the "gate-last" process. Furthermore, a gate structure with a high aspect ratio is more likely to have residue remaining in intersecting junctions of the dummy gate and a fin feature after a patterning process, such as in the footprint of the gate structure. The remaining residue may cause gate structure uniformity issue and deteriorate device performance. Therefore, how to continuously scale down gate structures with an increasing gate aspect ratio is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, and 2C show a flow chart of a method for forming one of the semiconductor structures shown in FIG. 1B, according to aspects of the present disclosure.

DETAILED DESCRIPTION

Figure 1A:
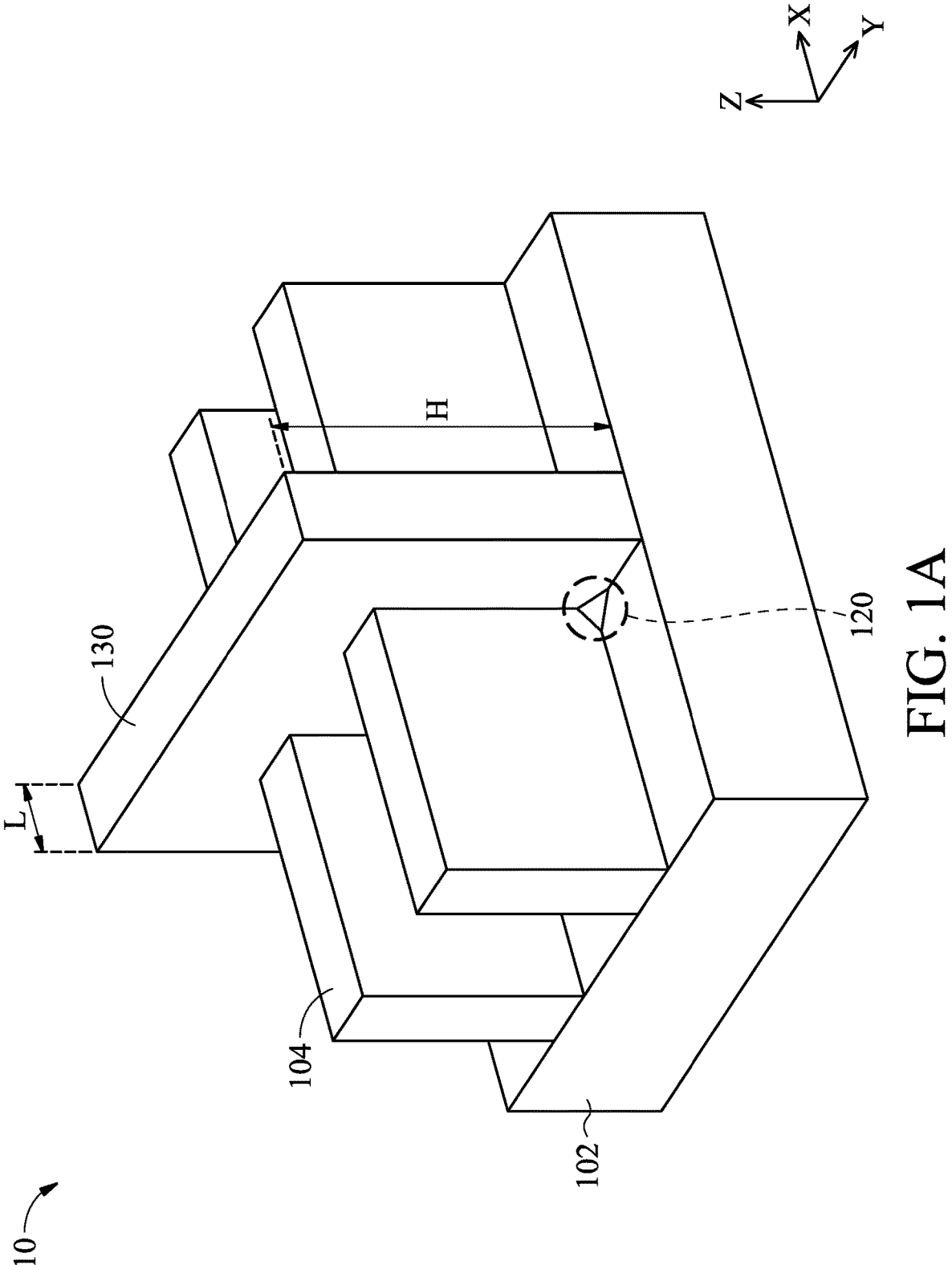
FIGS. 1A and 1B show perspective views of two semiconductor devices with gate structures engaging fin features, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods. More particularly, the present disclosure is related to providing a high aspect ratio gate structure with a notch in a footprint profile and a gate fabrication technique for forming the same, which enlarges processing windows for patterning high aspect ratio gate structures.

Figure 1B:
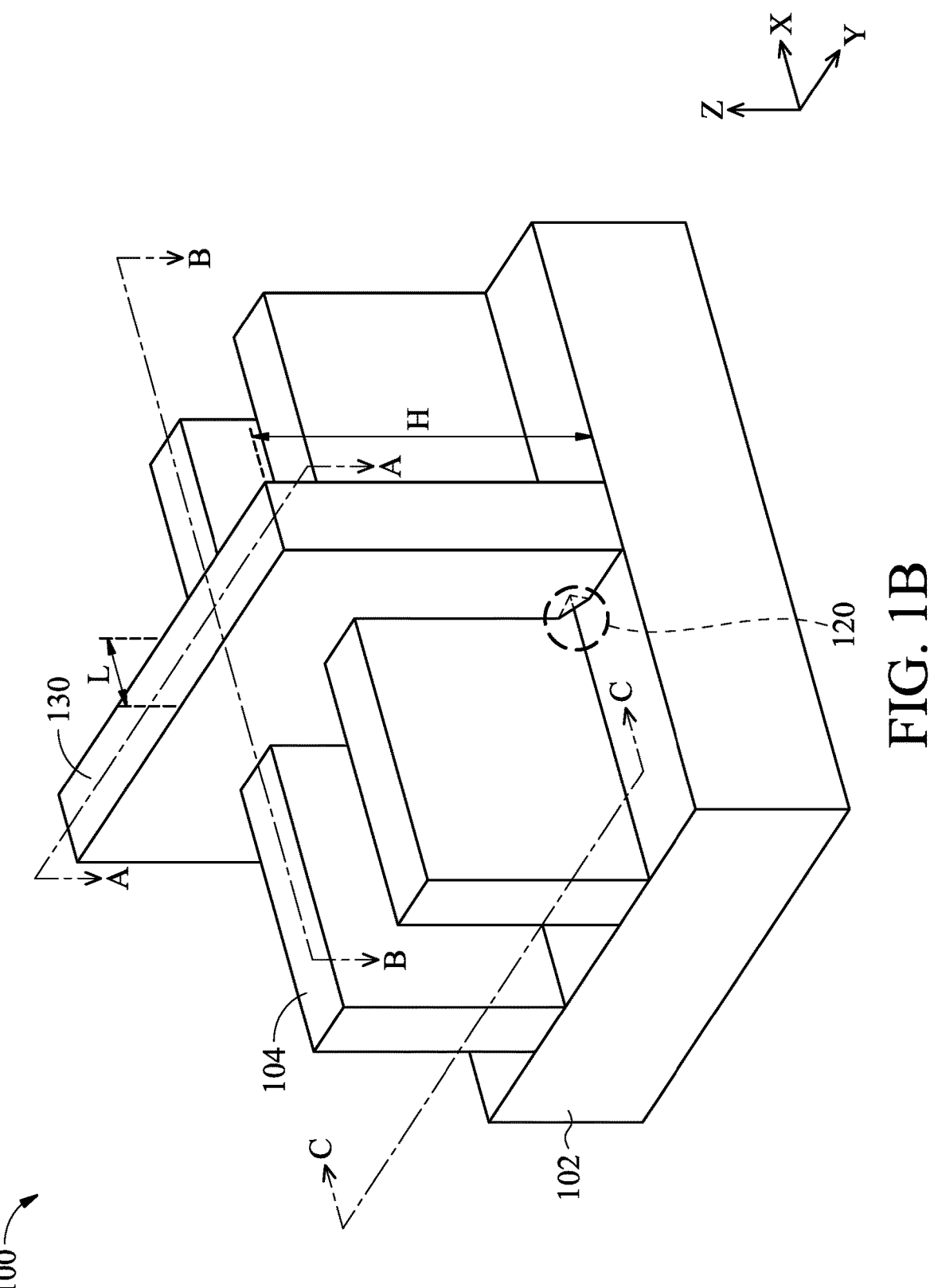

Referring to FIGS. 1A and 1B jointly, shown therein is a comparison between a device 10 and a device 100, which are intermittent devices during a Field-Effect Transistors (FETs) fabrication flow constructed according to embodiments of the present disclosure. Each of the devices 10 and 100 includes a substrate 102, a plurality of fins 104 (two shown in each device), and a gate structure 130 disposed over the fins 104. In the illustrated embodiment, the gate structure 130 is a dummy gate, such as a polysilicon gate structure, that will be replaced by a gate stack, such as a high-k metal gate stack, in a gate-last process. The gate structure 130 has a gate length L and a gate height H. The ratio between the gate height and the gate length (H/L) is defined as the gate aspect ratio. A higher gate aspect ratio, such as about 15:1 to about 30:1, allows transistors to take less area on a wafer and achieve a compact design. However, when the gate aspect ratio is above about 15:1, a dummy gate structure becomes so slim that it may not have enough mechanical strength to avoid collapses from occurring during a gate patterning process.

Another challenge raised by a high gate aspect ratio is corner residue problem. Corner residue refers to residue (or byproducts) remaining at a corner of intersecting junctions (e.g., corner 120 of device 10) where the dummy gate structure, the fin, and a top surface of the substrate meet (top portions of the substrate may include isolation features, as will be explained in further details below). Ideally, a gate patterning process will produce a vertical corner profile in the intersecting junctions. However, when the gate aspect ratio becomes large, the height of the residue is dwarfed by the relative height of the gate structure, causing difficulty in etching the residue. The residue accumulated in the corner results in gate length non-uniformity along the height of the dummy gate structure. When the dummy gate is replaced with a metal gate in the gate-last process, the metal gate will inherit this gate length non-uniformity and have a protrusion profile (i.e., larger gate length) at the corner, termed as "protruding corner." The non-uniformity affects many operating parameters of FETs, such as speed performance and power consumption. There is also a concern that the protrusion profile aggravates device shorting caused by metal material leakage from a protruding corner during the gate-last process, also known as "metal gate protrusion." As a comparison, corner 120 of the device 100 has a notch. The notch mitigates the risk of metal gate protrusion and reduces effective gate length at the bottommost portion of the gate structure.

Accordingly, an object of the present disclosure is to form gate stacks for FETs, such as fin-like FETs (FinFETs), with high gate aspect ratio without causing gate structure collapsing. In some embodiments of the present disclosure, the gate aspect ratio is above 15:1, such as from about 15:1 to about 30:1. A further object of the present disclosure is to form a gate stack free of protruding corners as a way to reduce the chance of metal gate protrusion from occurring. Still referring to FIGS. 1A and 1B, compared with corner 120 of device 10, corner 120 of device 100 has a notch that extends inwardly into the gate structure 130. The notch reduces effective gate length and enlarges distance from a footprint of the gate stack to other adjacent FETs features, which mitigates possible shorting caused by metal gate protrusion. These and other benefits will become evident after the discussion of various embodiments of the present disclosure as exemplified in FIGS. 2A-26.

Figure 2B:
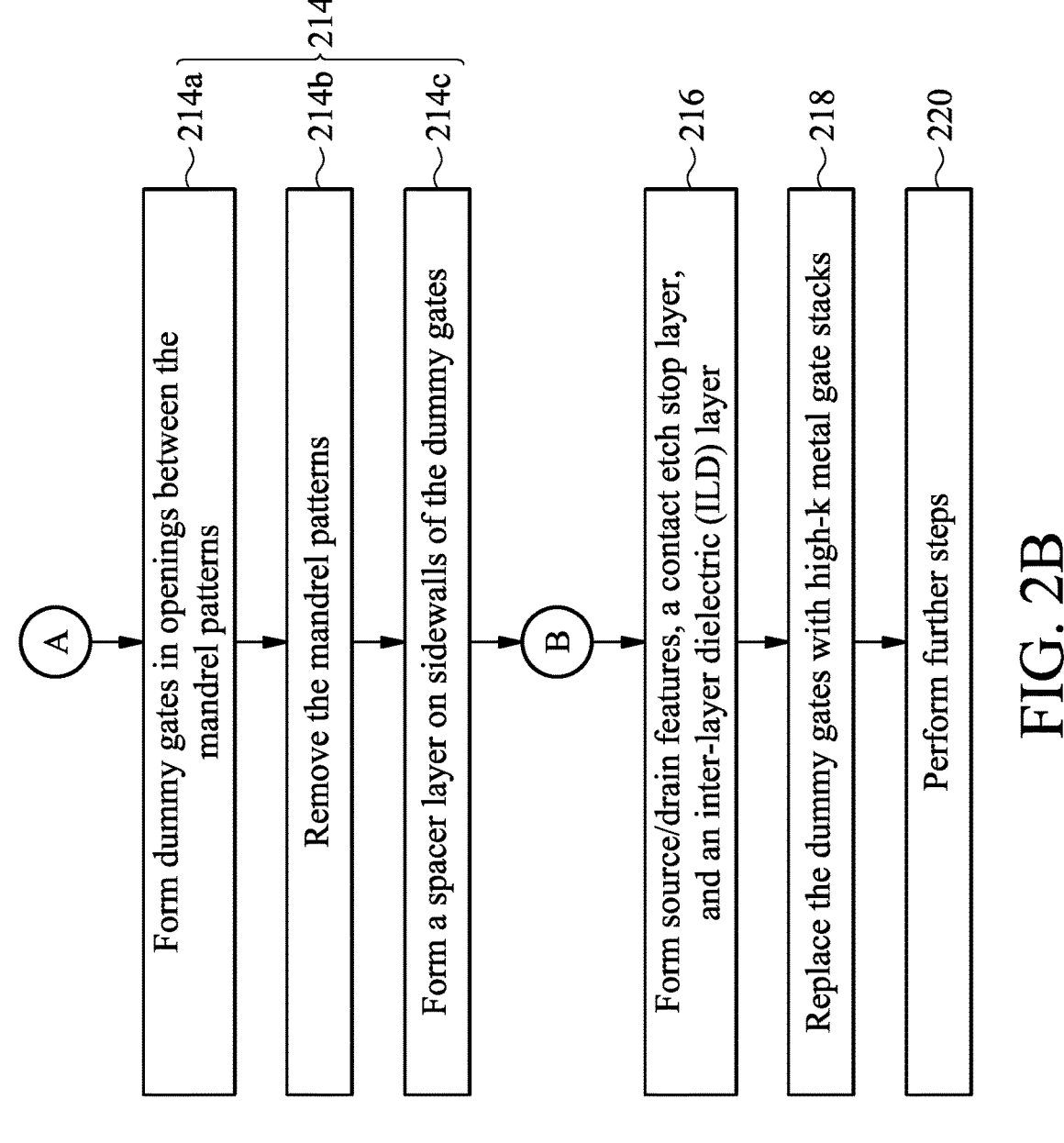
Figure 2C:
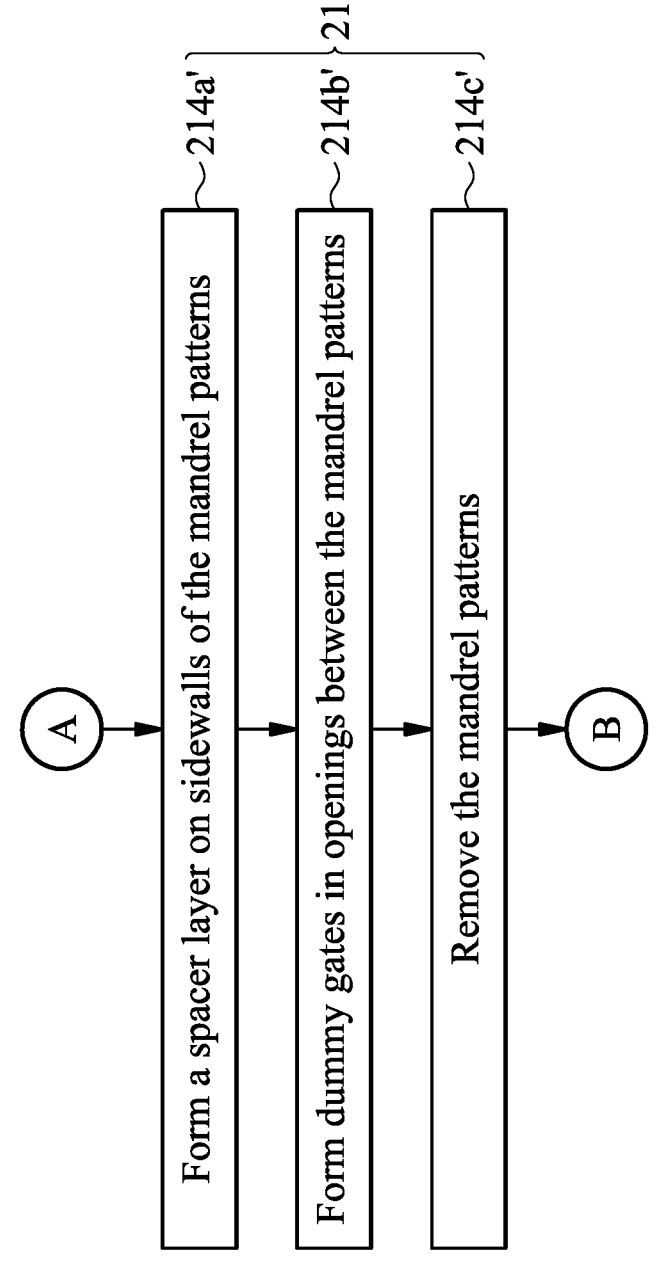

FIGS. 2A, 2B, and 2C illustrate a flow chart of a method 200 for forming a device 100 in accordance with some embodiments. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-26. FIGS. 3-26 illustrate various cross-sectional views of the semiconductor device 100 during fabrication steps according to the method 200. Specifically, FIGS. 3-7 illustrate a cross-sectional view of the device 100 along the A-A line of FIG. 1B. FIGS. 8, 9, 10A, 11, 12, 13A, 14A, 15, 16, 17, 18, 19, 20, 21, 22, 23A, 24A, 25A, and 26 illustrate cross-sectional views of the device 100 along the B-B line of FIG. 1B. FIGS. 10B, 13B, 14B, 23B, 24B, and 25B illustrate cross-sectional views of the device 100 along the C-C line of FIG. 1B, which is along a top surface of the substrate 102 to show a footprint profile of a gate structure.

Figure 3:
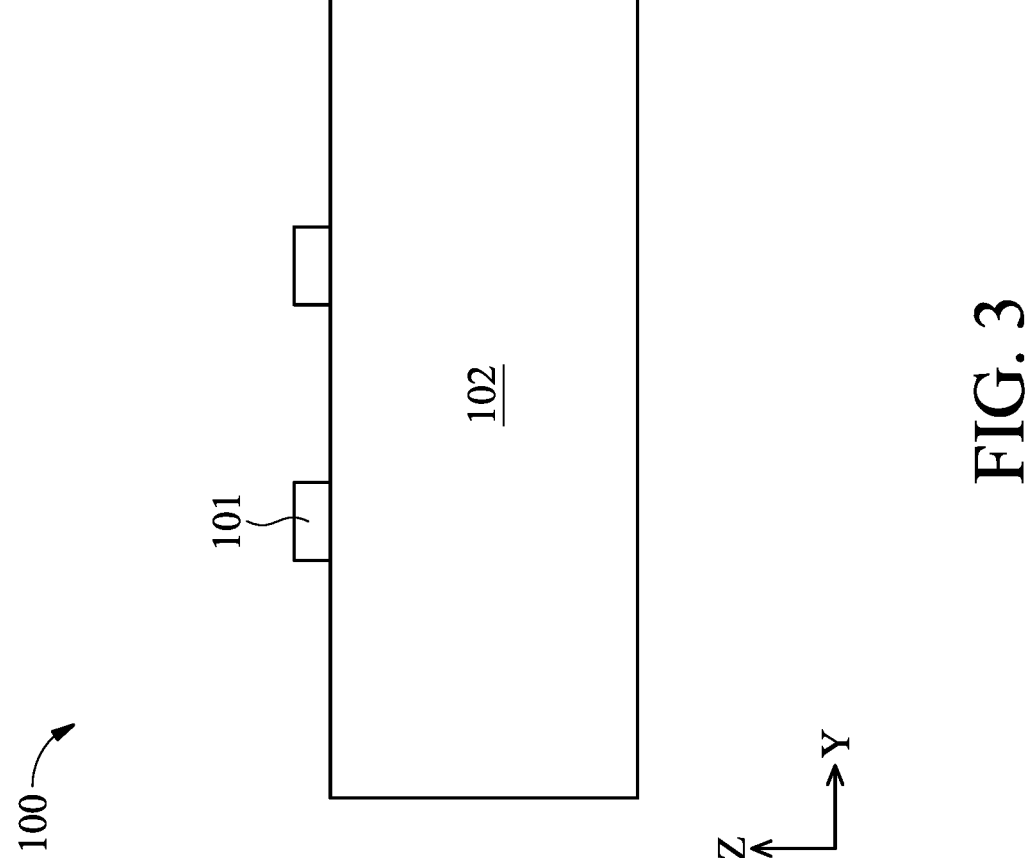
FIGS. 3, 4, 5, 6, 7, 8, 9, 10A, 11, 12, 13A, 14A, 15, 16, 17, 18, 19, 20, 21, 22, 23A, 24A, 25A, and 26 illustrate cross-sectional views in an X-Z plane of a semiconductor structure during a fabrication process according to the method of FIGS. 2A-2C, in accordance with an embodiment.

At operation 202, the method 200 (FIG. 2A) provides, or is provided with, a device structure 100 having a substrate 102, such as shown in FIG. 3. The device 100 may be an intermediate device fabricated during processing of an integrated circuit (IC) that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

In the illustrated embodiment, the substrate 102 is a silicon substrate. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In another embodiment, the substrate 102 includes indium tin oxide (ITO) glass. In various embodiments, the substrate 102 is a wafer, such as a silicon wafer, and may include one or more epitaxially grown semiconductor layers in its upper portion.

Operation 202 also includes forming a patterned mask 101 over the substrate 102. The patterned mask 101 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, become the patterned mask 101. The patterned mask 101 may include silicon oxide, silicon nitride, photoresist, or other suitable materials in various embodiments.

Figure 4:
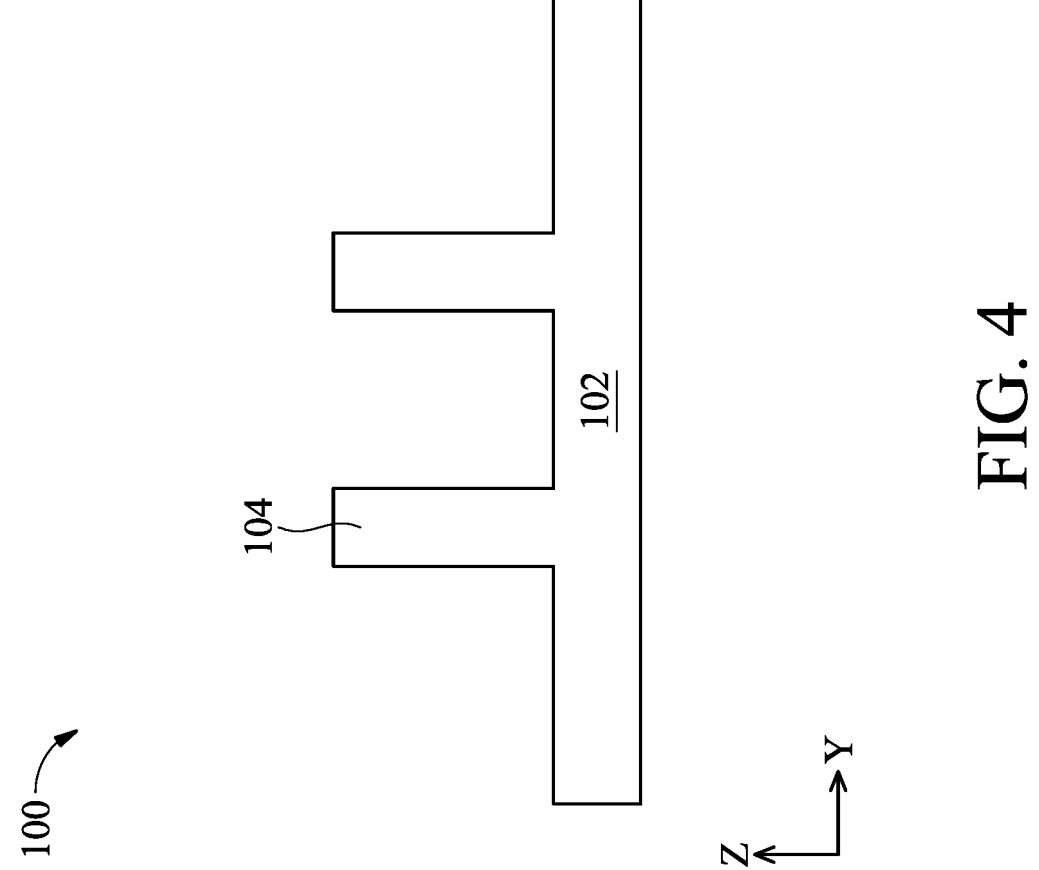

Operation 202 further includes etching the substrate 102 using the patterned mask 101 as an etch mask, thereby forming the fins 104, such as shown in FIG. 4. The patterned mask 101 is removed thereafter. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchants.

Figure 5:
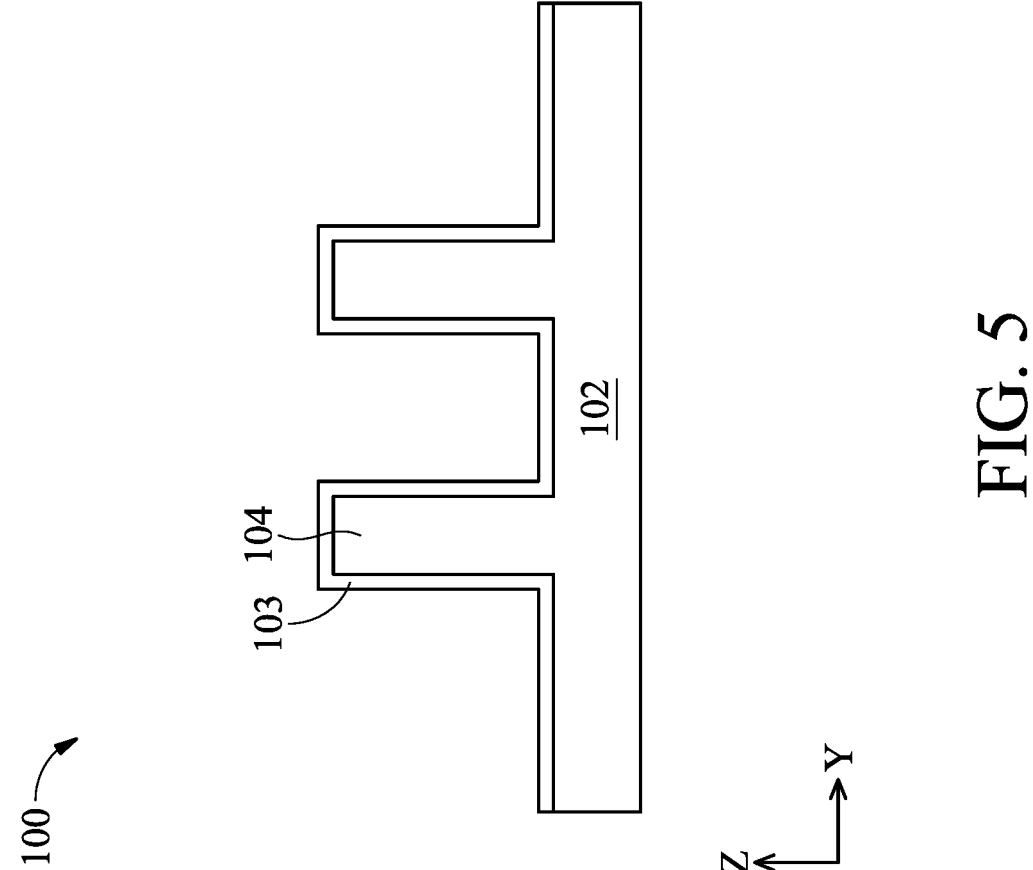

At operation 204, the method 200 (FIG. 2A) forms a liner layer 103 over sidewalls of the fins 104. In the illustrated embodiment, the liner layer 103 is deposited over top and sidewalls of the fins 104 and over a top surface of the substrate 102, such as shown in FIG. 5. To further the illustrated embodiment, the liner layer 103 includes silicon nitride (e.g., $Si_3N_4$), and may be deposited using chemical vapor deposition (CVD), physical vapor deposition (PVD), plasma-enhanced CVD (PECVD), and atomic layer deposition (ALD), or other suitable methods. The liner layer 103 may be deposited to a thickness of about 1 to about 5 nm, such as about 3 nm. Operation 204 may, operationally, further include applying an anisotropic etching process to the liner layer 103. The anisotropic etching process is designed to selectively etch the liner layer 103 but does not etch the substrate 102. The operation 204 may remove portions of the liner layer 103 from the top surface of the substrate 102, thereby exposing the substrate 102 between the fins 104 (not shown). The portion of the liner layer 103 on the sidewalls of the fins 104 remains substantially unetched due to the highly directional etching. Further, the top surface of the fins 104 may or may not be exposed by this anisotropic etching process. In an embodiment where the liner layer 103 includes silicon nitride, the operation 204 may employ a remote $O_2/N_2$ discharge with a fluorine-containing gas such as $CF_4$, $NF_3$, or $SF_6$, and may additionally include hydrogen ($H_2$) or $CH_4$. Various other methods of selectively etching the liner layer 103 are possible.

Figure 6:
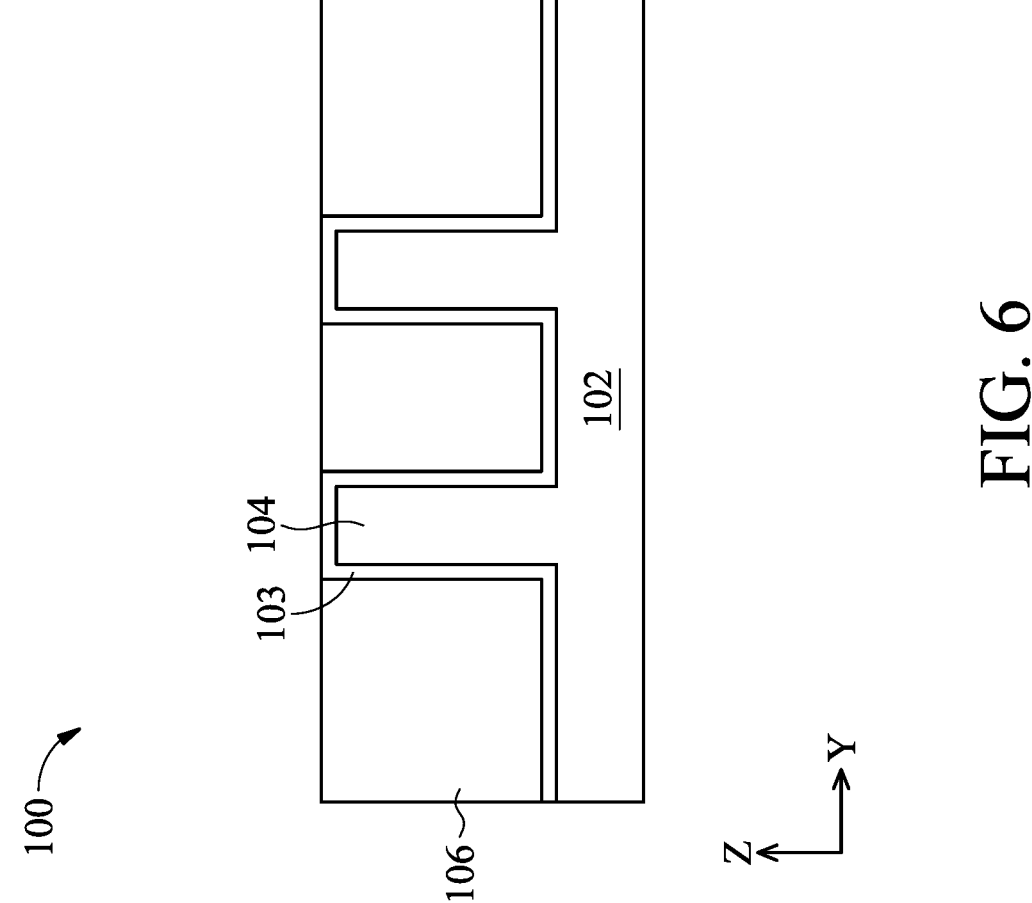

At operation 206, the method 200 (FIG. 2A) forms an isolation structure 106 over the liner layer 103 and filling spaces between the fins 104, such as shown in FIG. 6. The operation 206 may include a variety of processes such as deposition, annealing, chemical mechanical planarization (CMP), and etching back. For example, the operation 206 may deposit a flowable dielectric material over the substrate 102 and filling spaces between the fins 104. In some embodiments, the deposition of the flowable dielectric material includes introducing a silicon-containing compound and an oxygen-containing compound that react to form a flowable dielectric material, thereby filling the gaps. The material for the isolation structure 106 may include undoped silicate glass (USG), fluoride-doped silicate glass (FSG), phosphosilicate glass (PSG), borophosphosilicate glass (BPSG), or other suitable insulating material. Subsequently, the operation 206 treats the flowable material with some annealing processes to convert the flowable dielectric material into a solid dielectric material. The annealing processes may include dry annealing or wet annealing with a temperature ranging from 400° C. to 550° C. Thereafter, the operation 206 performs one or more CMP processes and/or etching back processes to recess the isolation structure 106.

Figure 7:
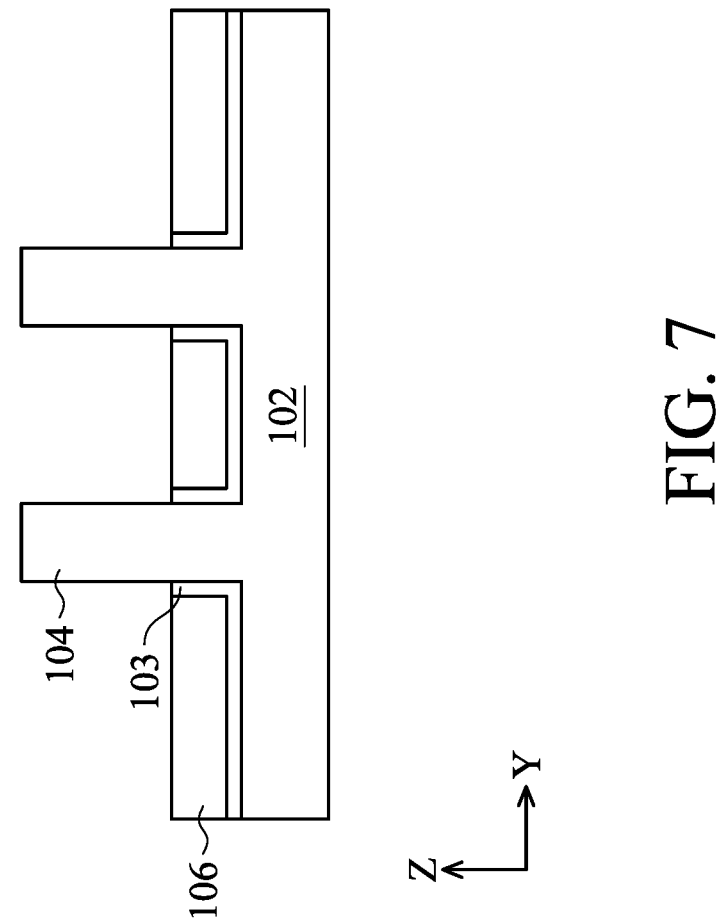

At operation 208, the method 200 (FIG. 2A) recesses the isolation structure 106 and the liner layer 103 to expose upper portions of the fins 104, such as shown in FIG. 7. The operation 208 may employ one or more wet etching, dry etching, reactive ion etching, or other suitable etching methods in various embodiments. For example, the isolation structure 106 and the liner layer 103 may be recessed in a single etching process. In alternative embodiments, the isolation structure 106 is recessed using a first etching process, and subsequently, the liner layer 103 is recessed using a second etching process.

Figure 8:
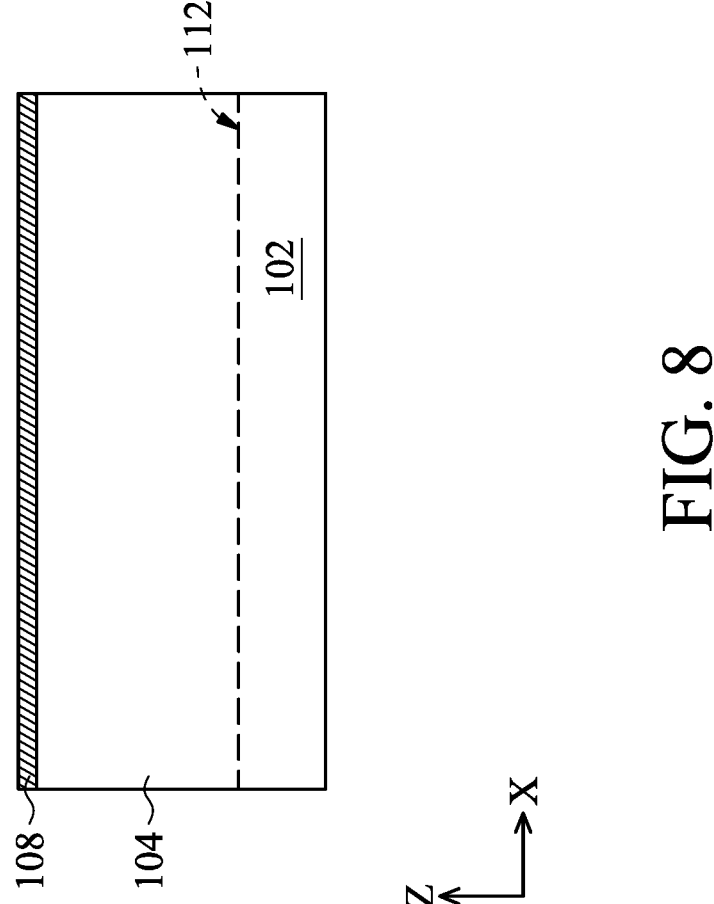

At operation 210, the method 200 (FIG. 2A) forms an oxide layer 108 on surfaces of the fins 104, such as shown in FIG. 8. In the illustrated embodiment, the oxide layer 108 is formed as a blanket layer over top and sidewall surfaces of the fins 106 and over the top surface of the isolation structure 106. In an alternative embodiment, the oxide layer 108 is formed on the top and sidewall surfaces of the fins 106 but not on the top surface of the isolation structure 106. The oxide layer 108 provides protection to the fins 104 in subsequent operations. The oxide layer 108 may be formed by various methods such as chemical oxidation of silicon, thermal oxidation of silicon, ozone oxidation of silicon, atomic layer deposition (ALD), chemical vapor deposition (CVD), physical vapor deposition (PVD), or other suitable methods. The oxide layer 108 may comprise silicon oxide or a high-k oxide (having a dielectric constant greater than that of silicon oxide) such as Hf oxide, Ta oxide, Ti oxide, Zr oxide, Al oxide or a combination thereof. The oxide layer 108 may be formed to have a thickness of a few angstroms to a few tens of angstroms.

Figure 9:
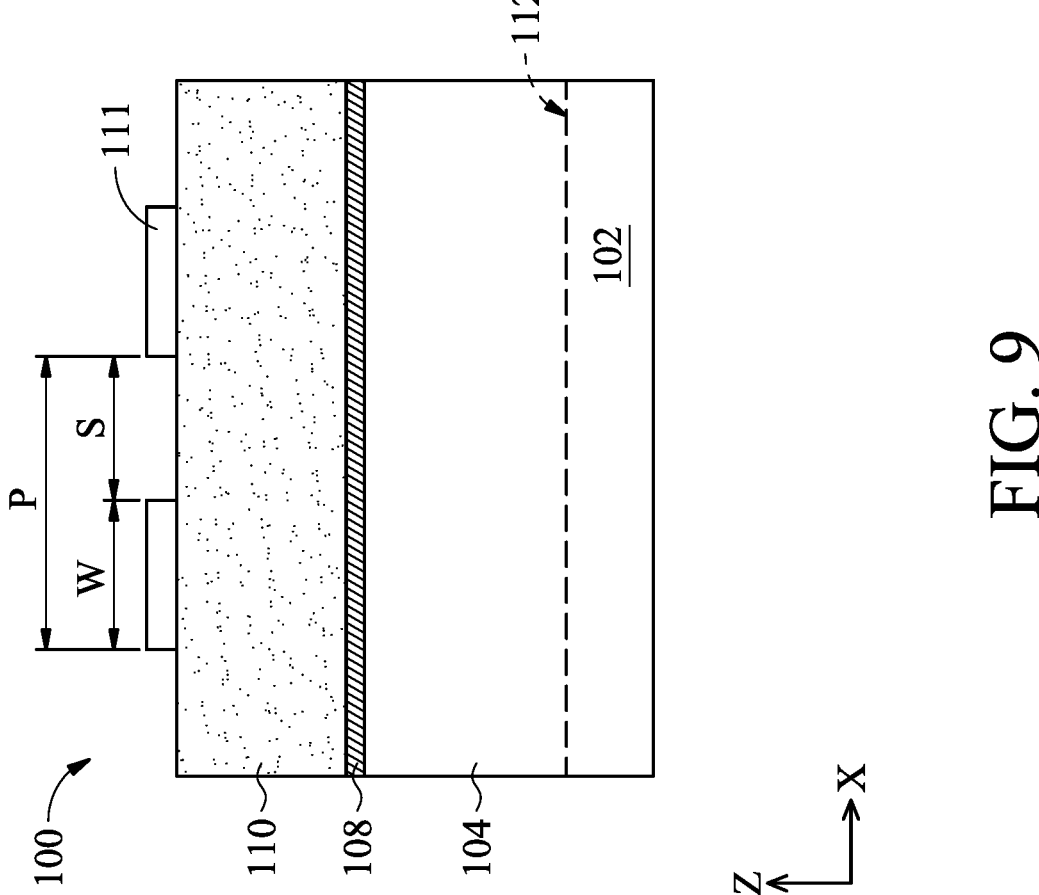

At operation 212, the method 200 (FIG. 2A) deposits a dielectric layer 110 covering the fins 104 and the substrate 102, such as shown in FIG. 9. Materials suitable for the dielectric layer 110 include, but not limited to, silicon oxide, plasma enhanced silicon oxide (PEOX), silicon nitride, polysilicon, doped polysilicon, silicon oxynitride, tetraethyl orthosilicate (TEOS), nitrogen-containing oxide, nitride oxide, high-k dielectric materials, low-k dielectric materials, or combinations thereof. In the illustrated embodiment, the dielectric layer 110 is a polysilicon layer. The dielectric layer 110 may be formed by one or more deposition techniques, such as CVD, PVD, PECVD, and ALD. The dielectric layer 110 is used for forming mandrel patterns over the fins 104. Therefore, the dielectric layer 110 is also referred to as the mandrel layer 110.

Operation 212 also includes forming a patterned hard mask layer 111 over the mandrel layer 110, such as shown in FIG. 9. The patterned hard mask layer 111 may include one or more layers of dielectric material such as silicon oxide, silicon nitride, silicon oxynitride, or a combination thereof. the patterned hard mask layer 111 is formed by a procedure including a photolithography process and one or more etching processes. An exemplary photolithography process may include forming a photoresist (not shown) over a hard mask layer. A lithographic exposure is performed that exposes selected regions of the photoresist to radiation. The exposure causes a chemical reaction to occur in the exposed regions of the photoresist. After exposure, a developer is applied to the photoresist. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist is developed, the exposed portions of the hard mask layer may be removed by an etching process, such as wet etching, dry etching, Reactive Ion Etching (RIE), ashing, and/or other etching methods, resulting in the patterned hard mask layer 111. After etching, the photoresist may be removed.

The patterned hard mask layer 111 includes a pattern of pitch P, width W, and spacing S (P=W+S) in the X-direction. In the illustrated embodiment, the X-direction is the direction along which the fins 104 extends lengthwise and the Z-direction is the normal of the substrate 102.

Figures 10A, 10B:
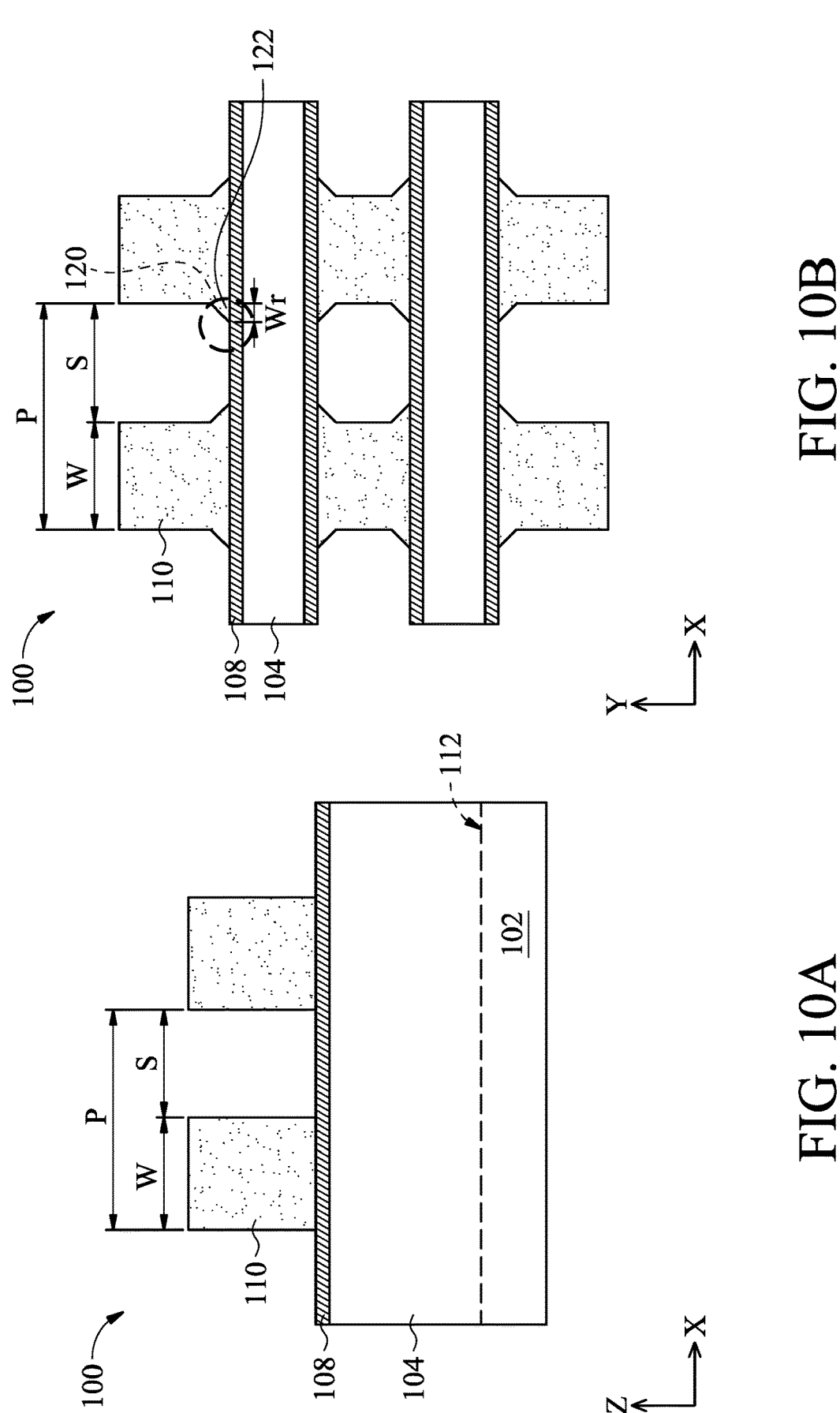
FIGS. 10B, 13B, 14B, 23B, 24B, and 25B illustrate cross-sectional views in an X-Y plane of a semiconductor structure during a fabrication process according to the method of FIGS. 2A-2C, in accordance with an embodiment.

Operation 212 further includes patterning the mandrel layer 110 by etching through the openings of the patterned hard mask layer 111, thereby forming mandrel patterns, such as shown in FIG. 10A. The patterned hard mask layer 111 may be subsequently removed. In a particular embodiment, the patterning of the mandrel layer 110 includes a dry etching process, such as plasma etching, reactive-ion etching (RIE), or other suitable anisotropic etching methods. Relatively speaking, the merits of implementing a dry etching process are due mainly to its simplicity of controlling the plasmas and its result of producing more repeatable results than other processes, such as a wet etching method. Many plasma parameters, such as gas pressure, chemistry, and the source/biased power can be varied or modified during the dry etch process to fine-tune resulted mandrel patterns' sidewall profile. The dry etching process includes the usage of one or more etchants or a mixture of etchants. In one embodiment, the etchant may have the atoms of chlorine, fluorine, argon, bromine, hydrogen, carbon, or a combination thereof. For example, the etchant may be a plasma containing a mixture of $CF_4$ and $Cl_2$. In furtherance of the example, the etching process is applied with a $CF_4/Cl_2$ flow rate between 0 and about 500 sccm, a gas pressure between 0 and about 60 mtorr, an RF power less than about 1000 W, and a bias voltage between 0 and about 200 V. In another embodiment, the etchant is a plasma containing a mixture of $Cl_2$, $O_2$, $CF_4$, $BCl_3$, and $CHF_3$. In yet another embodiment, the etchant is a plasma containing a mixture of HBr and $O_2$. The etching process may be performed inside a plasma etch reactor, with other parameters such as a HBr flow rate less than about 500 sccm, a gas pressure less than about 60 mtorr, an RF power less than about 1000 W, and a bias voltage less than about 200 V.

After forming mandrel patterns in operations 212, the mandrel layer 110 is denoted as mandrel patterns 110 for simplicity and ease of understanding. The mandrel patterns 110 have a width W and a spacing S, which jointly define the pitch P (P=W+S). In some embodiments, the width W ranges from about 20 nm to about 60 nm, the spacing S ranges from about 10 nm to about 25 nm, such as for use in process technology below 20 nm. In the illustrated embodiment, the width W is larger than the spacing S. As an example, a ratio between W and S may range from about 2.5:1 to about 4:1. As will be explained in further detail below, dummy gates will be formed in the openings (spacing S) of the mandrel patterns 110. Therefore, what mandrel patterns 110 define is a spacing between dummy gates. By first defining a relatively larger gate spacing instead of directly defining the gate itself, this method obviates a need to directly pattern a gate structure which often suffers from gate collapsing issues when the gate aspect ratio is high.

Mandrel patterns 110 also cover sidewalls of the fins 104 and extend downwardly to a top surface of the isolation structure 106 (FIG. 7). A dotted line 112 in FIG. 10A marks a position of the top surface of the isolation structure 106. FIG. 10B is a cross-sectional view of the device 100 cutting through the dotted line 112, which shows a footprint profile of the mandrel patterns 110. FIG. 10B again highlights the difficulty of etching the corners 120 at intersecting junctions of a high aspect ratio feature (here mandrel patterns 110) and a fin feature (fins 104), where residue 122 remains. The residue 122 is dwarfed by the relative height of both the mandrel patterns 110 and the fins 104, which is typically 10-100 times higher than that of the residue 122. The residue 122 may have a width $W_r$ about 3% to about 10% of the width W of the mandrel patterns 110. The residue 122 distorts an otherwise vertical corner 120 to a protruding corner 120.

Figure 11:
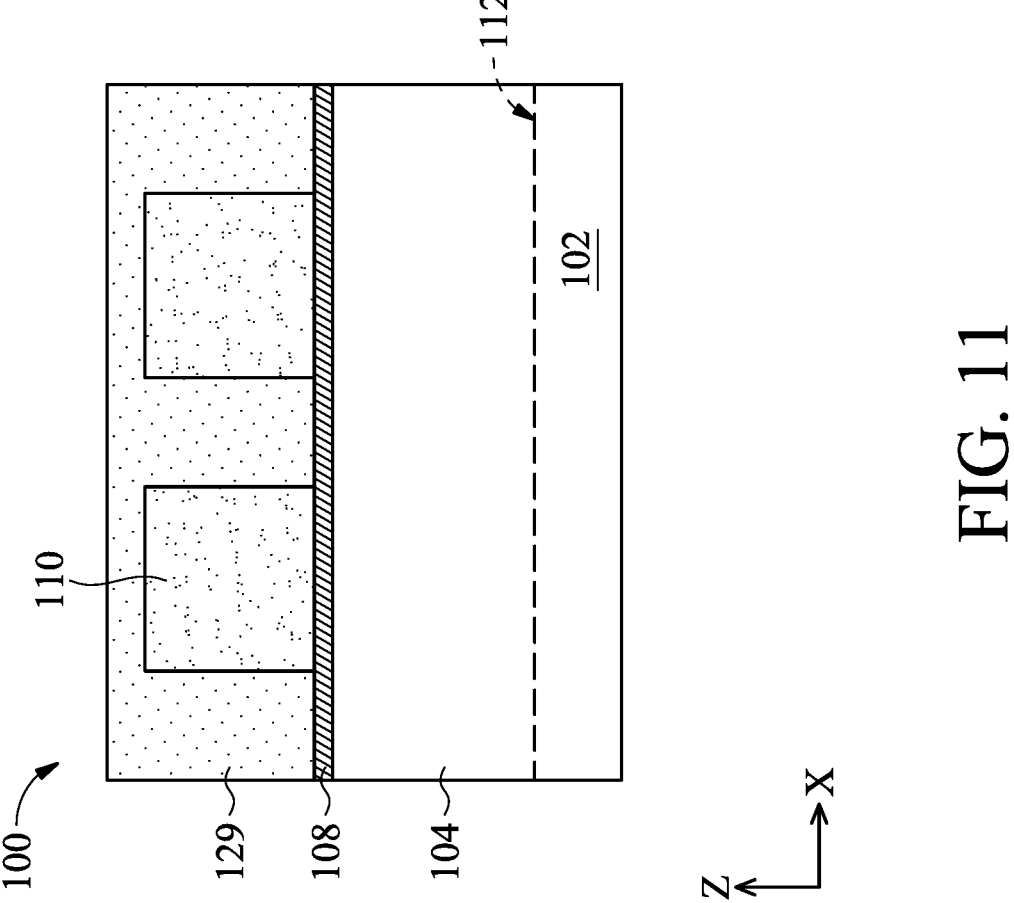

Referring to FIG. 2B, the method 200 proceeds to operation 214 to form dummy gates. In some embodiments, operation 214 includes multiple steps, such as steps 214a-214c. At step 214a, the method 200 forms a dielectric layer 129 covering the mandrel patterns 110 and filling openings therebetween, such as shown in FIG. 11. As will be explained in further detail below, the dielectric layer 129 will eventually be removed in subsequent operations, therefore the dielectric layer 129 is also referred to as a sacrificial layer. The dielectric layer 129 may be formed by one or more deposition techniques, such as CVD, PVD, PECVD, and ALD. Material suitable for the dielectric layer 129 includes, but not limited to, silicon oxide, silicon nitride, silicon oxynitride, a polymer such as polyimide, low-k dielectrics such as carbon doped oxides, extremely low-k dielectrics such as porous carbon doped silicon dioxide, high-k dielectrics such as metal oxides including $HfO_2$, $HfZrO_x$, $HfSiO_x$, $HfTiO_x$, $HfAlO_x$, TiN, the like, or a combination thereof. The selection of the material is such that the dielectric layer 129 has different material composition than the mandrel patterns 110 to achieve a high etching selectivity between the mandrel patterns 110 and dielectric layer 129 (e.g., an etching selectivity ranges from about 5:1 to about 20:1). In the illustrated embodiment, the mandrel patterns 110 include polysilicon and the dielectric layer 129 includes silicon nitride. Step 214a also includes recessing the dielectric layer 129 to expose a top surface of the mandrel patterns 110, for example in one or more chemical mechanical planarization (CMP) processes and/or etching back processes to recess the dielectric layer 129.

Figure 12:
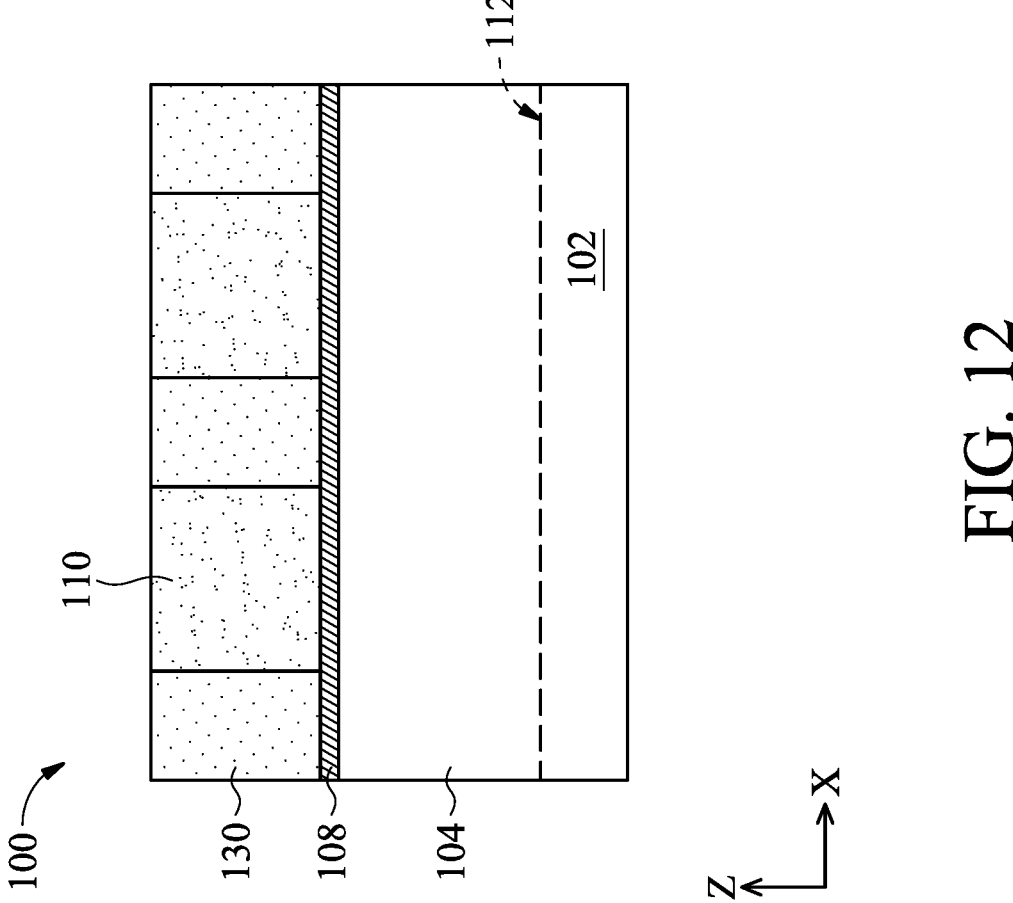

As shown in FIG. 12, after step 214a, the recessed dielectric layer interleaves with the mandrel patterns 110 in the X-direction, thereby forming sacrificial patterns, specifically as place holders for to-be-formed gates. Therefore, after step 214a, the recessed dielectric layer is also referred to as the dummy gates 130 for simplicity and ease of understanding.

Figures 13A, 13B:
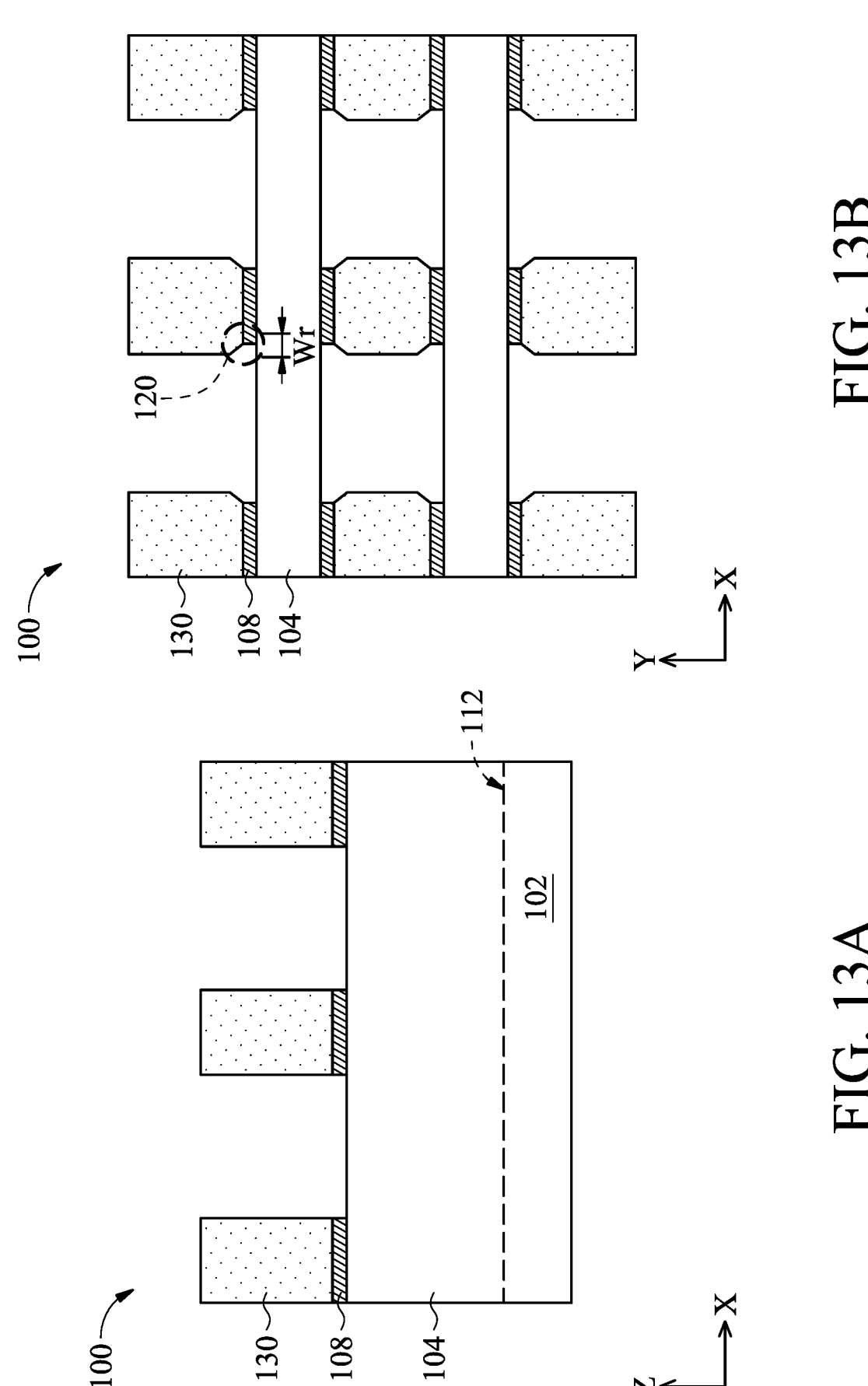

At step 214b, the method 200 (FIG. 2B) removes mandrel patterns 110 in a selective etching process, such that the dummy gates 130 substantially remains, as shown in FIGS. 13A and 13B. Step 214b may include a dry etching or a wet etching process. The etchant is selected such that a high etching selectivity exists between the mandrel patterns 110 and the dummy gates 130. In the present embodiment, the etching process is a wet etching process with diluted hydrofluoric acid (DHF) solution having a ratio of about 1:500 as an etchant. The etching process may be performed under a specified temperature for the etchant and for a specified time period. The temperature and time period may be adjusted to control the amount of material to be etched and may be determined by any suitable method. The device 100 may also be spun during the etching process. In the present embodiment, the etching process is performed at a temperature of about 23° C. and for a period of about 10 seconds, while the device 100 is spun at a rate of about 1000 rotations per minute (rpm). It is understood that the specified spin rate is a mere example and that other spin rates may be used depending on various factors, such as the etchant composition, etchant flow rate, and dispenser position. Portions of the oxide layer 108 under the mandrel patterns 110 are also removed in step 214b, by either the same etching process or a separate etching process. For example, step 214*b* may use a solution having a fluoride compound as an etchant to remove portions of the oxide layer 108. The fluoride compound is effective at removing a silicon oxide material. The etching process exposes the sidewalls of the dummy gates 130.

Step 214*b* further includes a rinsing process in which pressurized de-ionized water (DIW) may be sprayed onto the device 100. The rinsing process may be applied to the device 100 to remove residuals, particles, and/or byproducts remaining over sidewalls of the dummy gates 130, and especially from the corners 120. During the rinsing process, residuals, particles, and/or byproducts in the corners 120 is washed away by pressurized DIW droplets. Consequently, after the corners 120 is cleaned up, the dummy gates 130 have a notch in its footprint profile, which extends inwardly into the dummy gate 130. The width $W_r$ of the notch may range from about 3% to about 10% of a width of the dummy gates 130. The inventors of the present disclosure have observed this range provides a good compromise of effective mitigation of metal gate protrusion and acceptable gate mechanical strength, such that when the notch is less than 3% the mitigation of metal gate protrusion is not obvious and when the notch is larger than 10% the gate mechanical strength is weakened from its base.

Figures 14A, 14B:
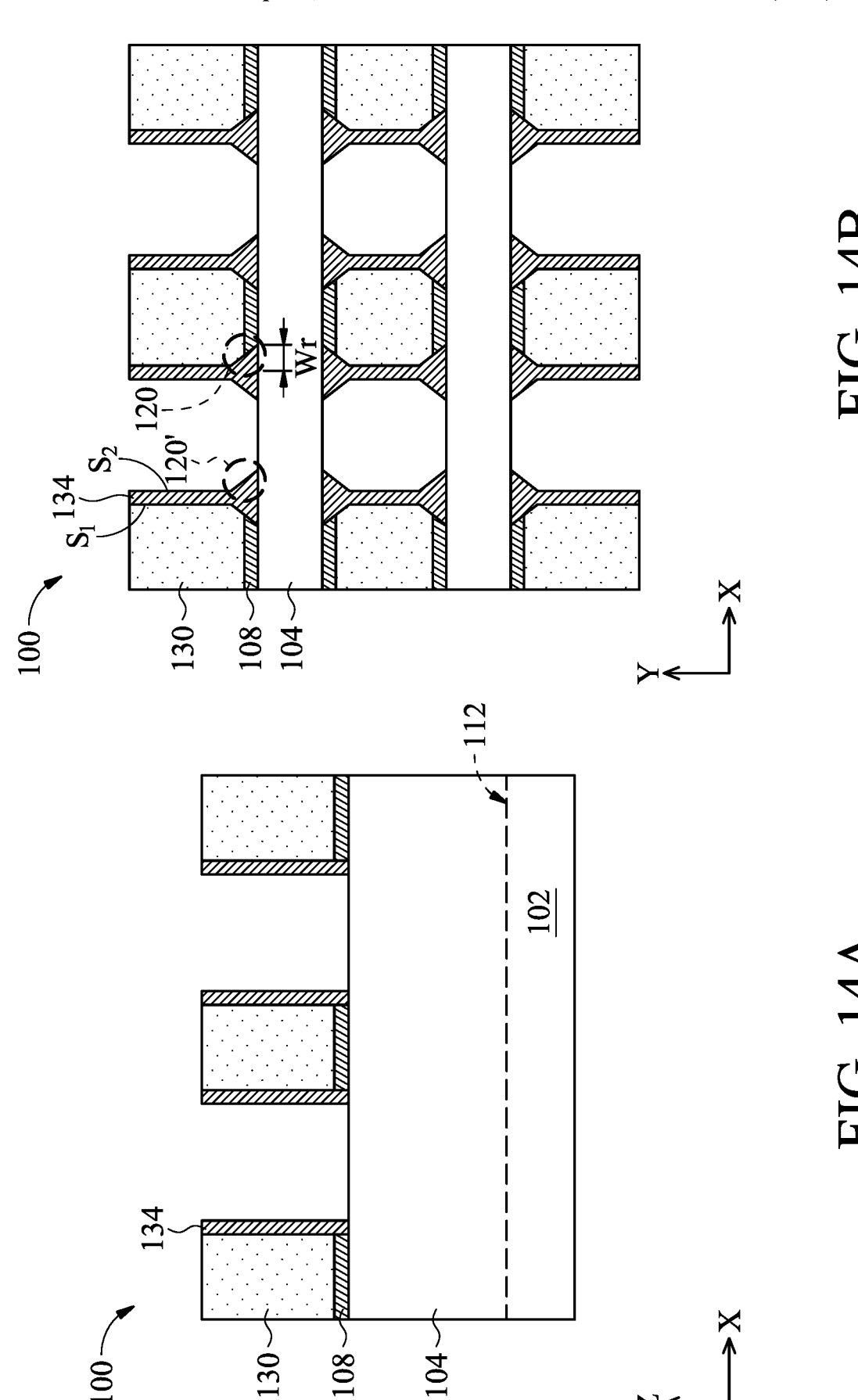

At step 214*c*, the method 200 (FIG. 2B) forms the gate spacer 134 on sidewalls of the dummy gates 130, as shown in FIGS. 14A and 14B. The gate spacer 134 may comprise a dielectric material, such as silicon oxide, silicon nitride, silicon oxynitride, silicon carbide, other dielectric material, or combinations thereof, and may comprise one or multiple layers of material. The gate spacer 134 may be formed by depositing a spacer material as a blanket over the dummy gates 130 and the fins 104. Then the spacer material is etched by an anisotropic etching process. Portions of the spacer material on the sidewalls of the dummy gates 130 remain and become the gate spacer 134. To be noticed, as shown in FIG. 14B, the gate spacer 134 fills the corner 120 at the footprint of the dummy gates 130, but also creates a protruding corner 120' in its own footprint profile during the anisotropic etching, for similar reasons discussed above with respect to the forming of the mandrel patterns 110 (FIG. 10B). In other words, the gate spacer 134 can be considered as having a sidewall $S_1$ facing the dummy gate 130 with a bottom portion tilted inwardly towards the dummy gate 130 and another sidewall $S_2$ opposing the sidewall $S_1$ with a bottom portion tilted outwardly away from the dummy gate 130.

Figure 15:
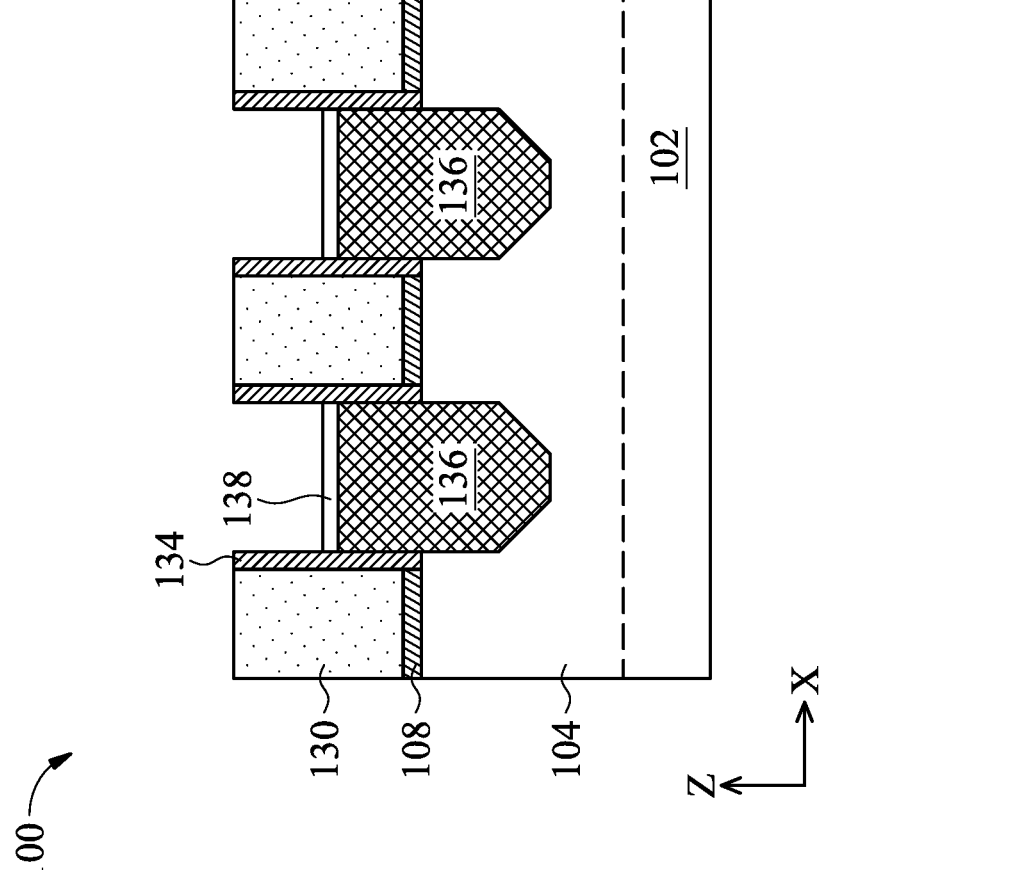
Figure 16:
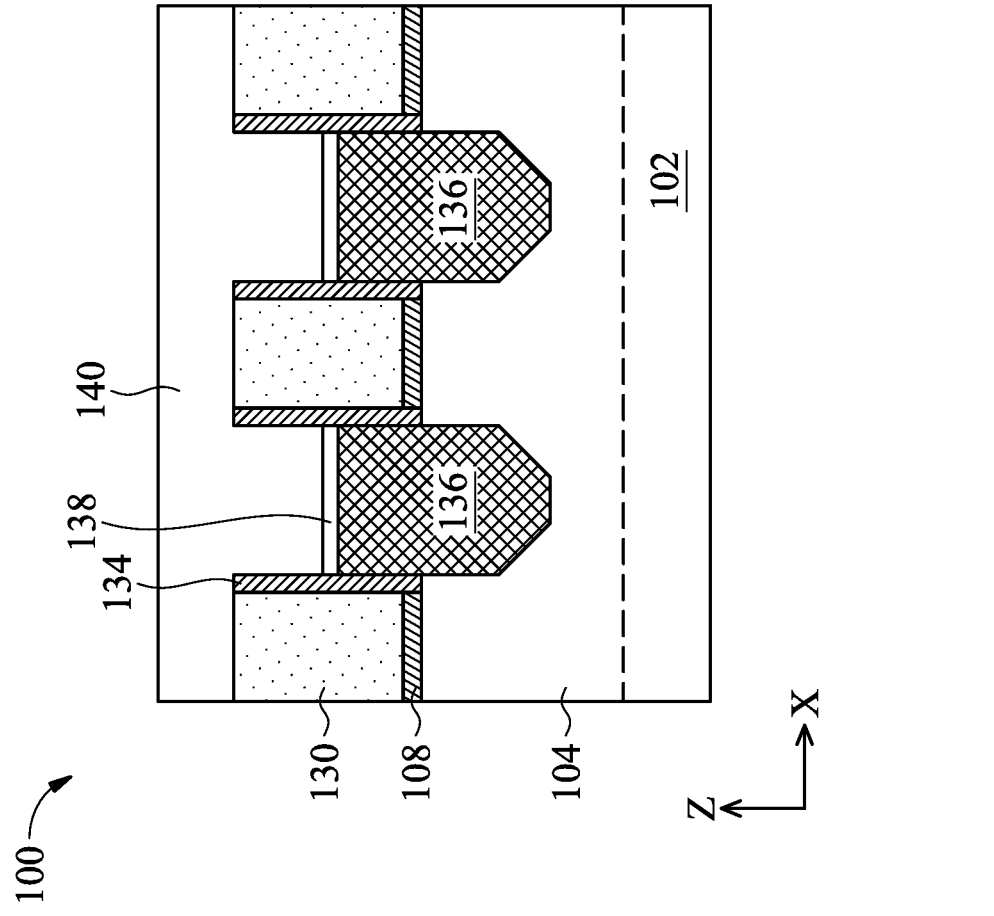
Figure 17:
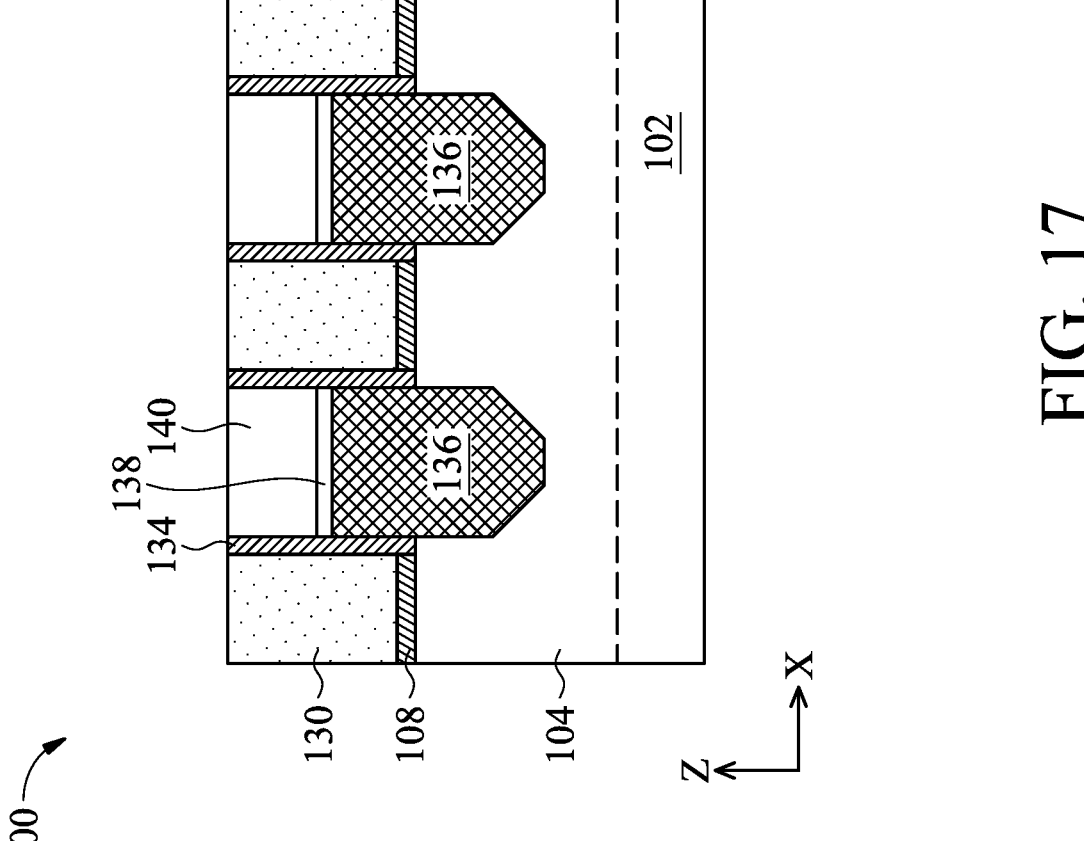

Referring to FIG. 2B, the method 200 proceeds to operation 216 to form various features, including source/drain (S/D) features 136, a contact etch stop layer (CESL) 138, an interlayer dielectric (ILD) layer 140, such as shown in FIGS. 15-17. Operation 216 includes a variety of processes. In some embodiments, operation 216 forms the S/D features 136 over the fins 104, the CESL 138 over the S/D features 136, and the ILD layer 140 over the CESL 138. For example, operation 216 may etch recesses into the fins 104 adjacent to the gate spacer 134, and epitaxially grow semiconductor materials in the recesses. The semiconductor materials may be raised above the top surface of the fins 104. Operations 216 may form the S/D features 136 separately for NFET and PFET devices. For example, operation 216 may form the S/D features 136 with n-type doped silicon for NFET devices or p-type doped silicon germanium for PFET devices. Thereafter, operation 216 may deposit the CESL 138 over the S/D features 136, as shown in FIG. 15. The CESL 138 may comprise silicon nitride, silicon oxynitride, silicon nitride with oxygen (O) or carbon (C) elements, and/or other materials; and may be formed by CVD, PVD, ALD, or other suitable methods. In some embodiments, the CESL 138 is deposited as a blanket layer, which also covers top surfaces of the dummy gates 130 and sidewalls of the gate spacer 134 (not shown). Subsequently, the operation 218 may deposit the ILD layer 140 covering the device 100, as shown in FIG. 16. The ILD layer 140 may comprise tetraethylorthosilicate (TEOS) oxide, undoped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The ILD layer 140 may be formed by PECVD, FCVD, or other suitable methods. Subsequently, operation 216 performs one or more CMP processes to planarize the device 100 and recess the ILD layer 140 to expose a top surface of the dummy gates 130, as shown in FIG. 17.

Figure 18:
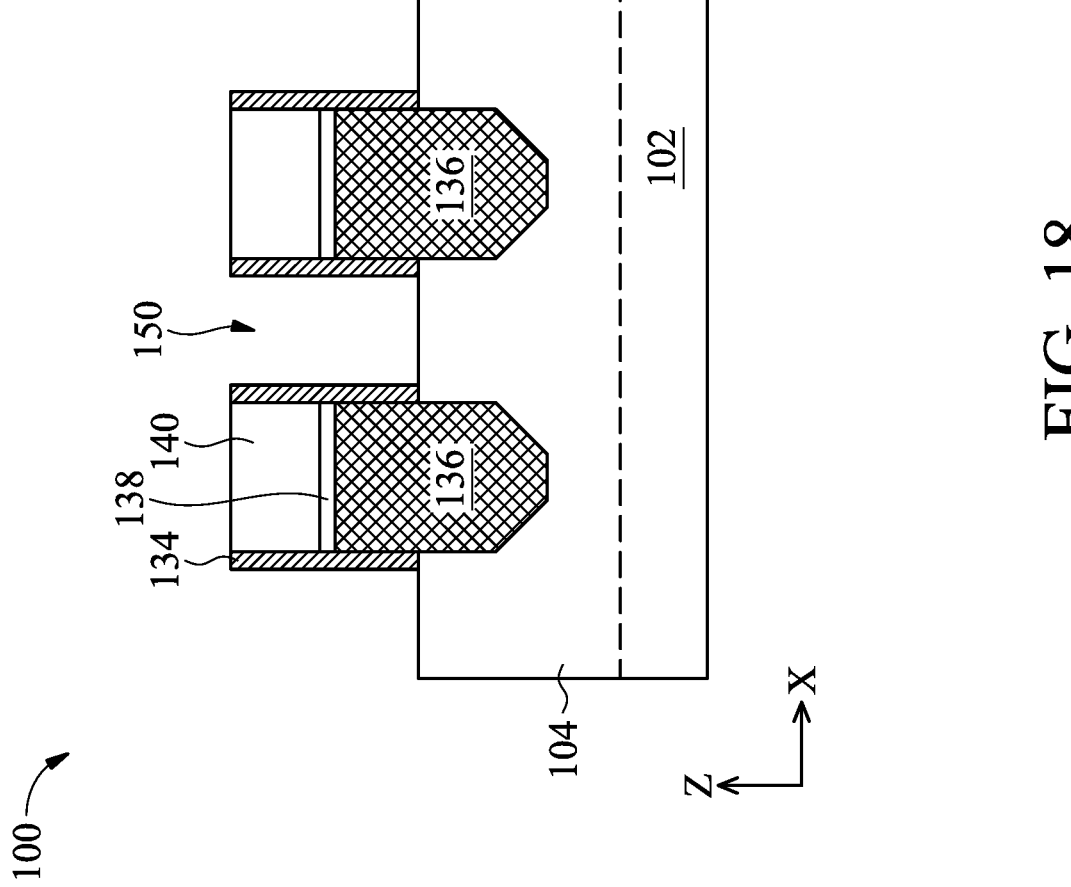
Figure 19:
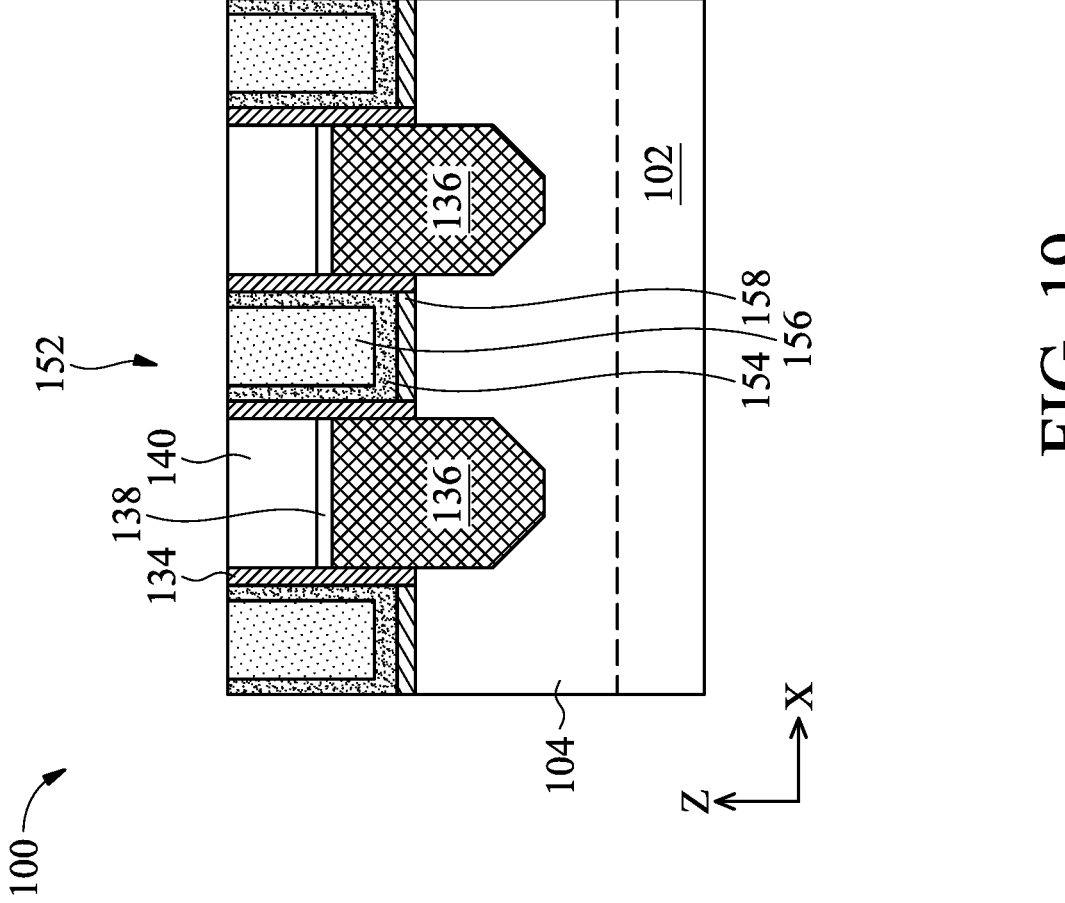

At operation 218, in a replacement gate process, the method 200 (FIG. 2B) replaces dummy gates with high-k metal gate stacks, such as shown in FIGS. 18 and 19. The operation 218 begins by removing the dummy gates 130 to form gate trenches 150 between the gate spacers 134 (FIG. 18) and deposits high-k metal gate stacks 152 in the gate trenches 150 (FIG. 19). The high-k metal gate stacks 152 include a high-k dielectric layer 154 and a conductive layer 156. The high-k metal gate stacks 152 may further include an interfacial layer 158 (e.g., silicon dioxide or silicon oxynitride) between the high-k dielectric layer 154 and the fins 104. The interfacial layer may be formed using chemical oxidation, thermal oxidation, ALD, CVD, and/or other suitable methods. The high-k dielectric layer 154 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate (SrTiO$_3$), or a combination thereof. The high-k dielectric layer 108 may be deposited using CVD, ALD and/or other suitable methods. The conductive layer 156 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials. The conductive layer 156 may be deposited using methods such as CVD, PVD, plating, and/or other suitable processes. As the high-k metal gate stacks 152 replace the dummy gates 130, the high-k metal gate stacks 152 also inherit the notch at its footprint, such that a bottom portion of the high-k dielectric layer 154 has the notching profile. In other words, a bottom portion of the sidewalls of the gate stack tilts inwardly towards the gate stack. In some embodiments, if the high-k dielectric layer 154 is lower than a height of the notch, a bottom portion of the conductive layer 156 also has the notching profile. In some embodiments, if the high-k dielectric layer 154 is thicker than a height of the notch, a bottom portion of the conductive layer 156 is free of the notching profile.

Figure 20:
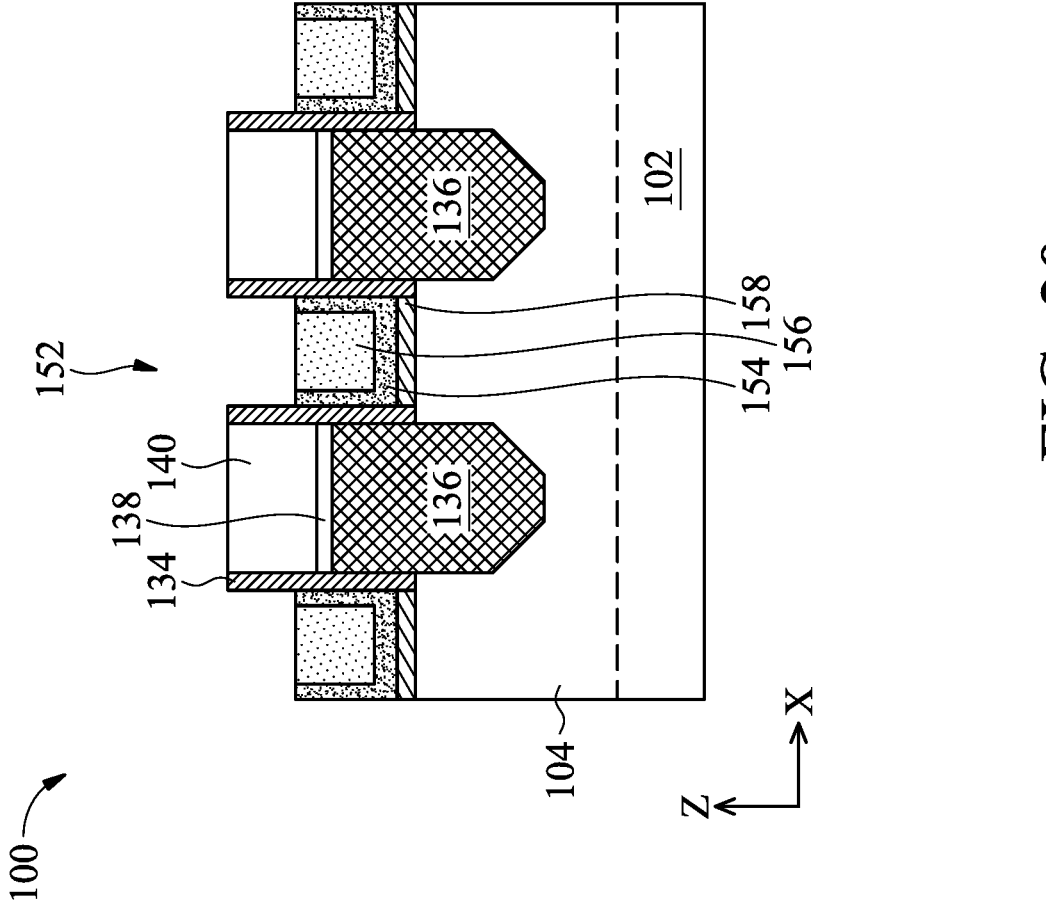
Figure 21:
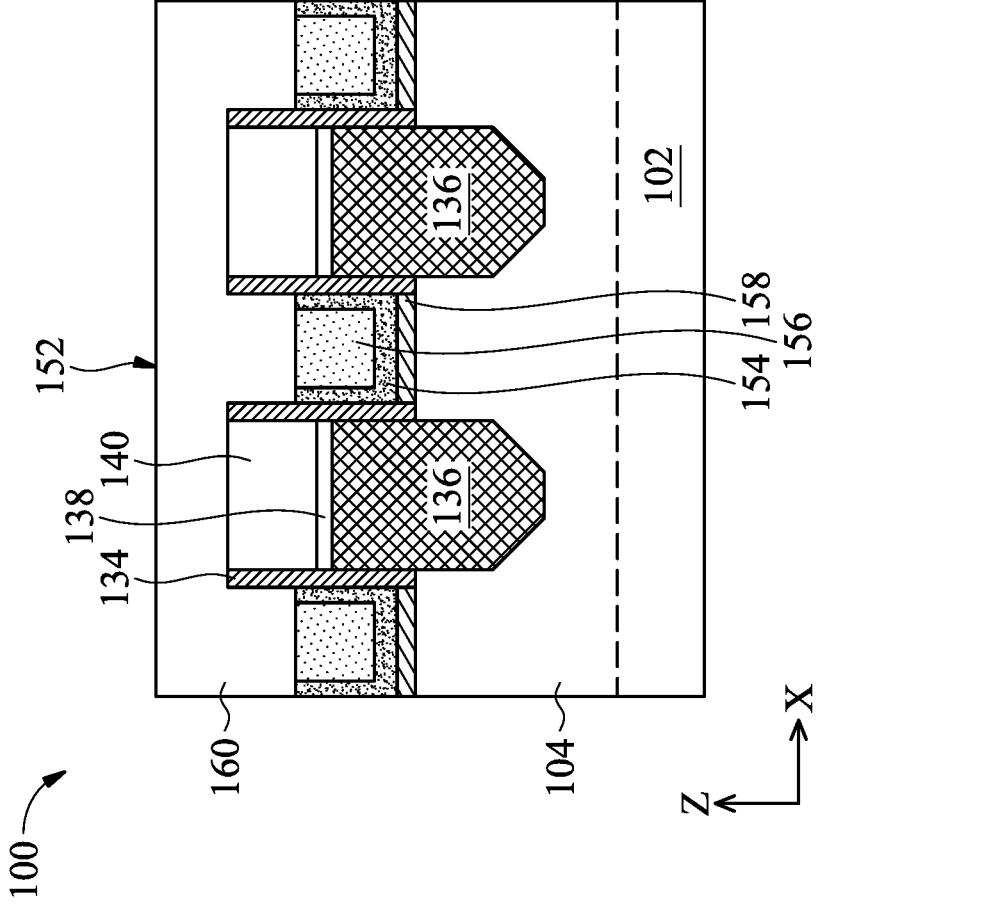
Figure 22:
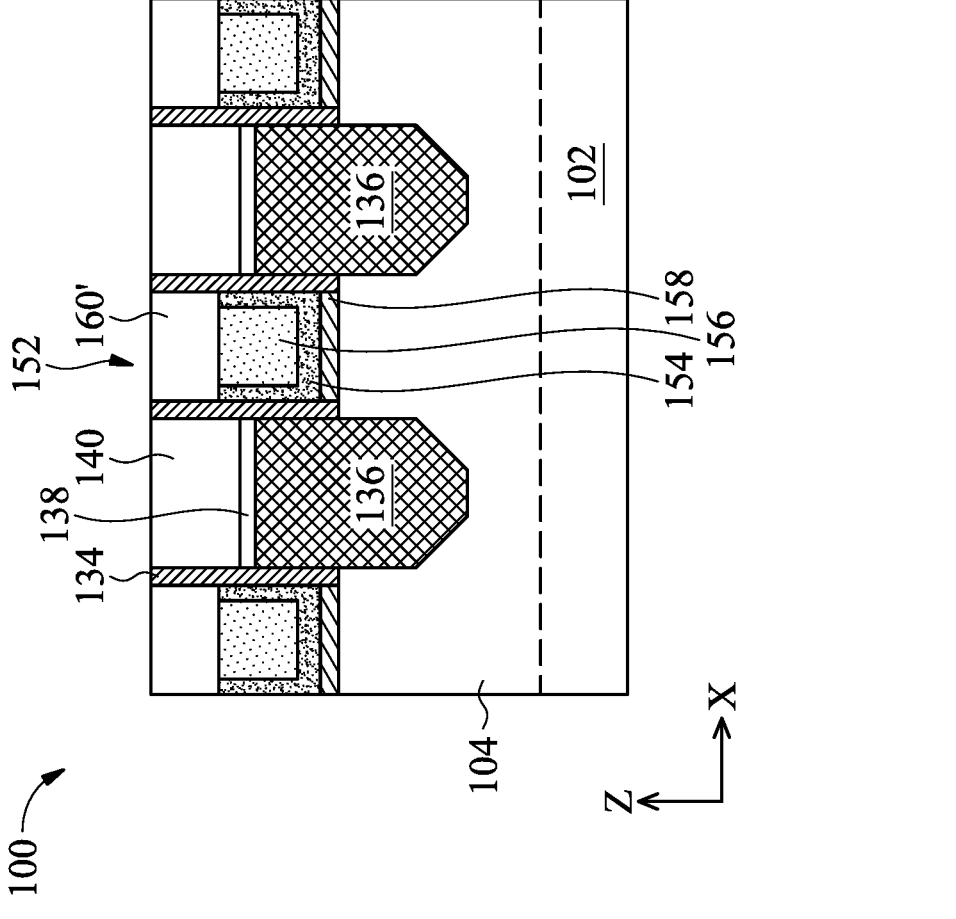

At operation 220, the method 200 (FIG. 2B) performs further steps to complete the fabrication of the device 100. For example, the method 200 may form self-aligned contacts on the high-k metal gate stacks 152 as to form metal interconnects connecting various transistors to form a complete IC. In one embodiment, forming self-aligned contacts includes first recesses the high-k metal gate stacks 152 in an etching process, such as a dry etching process or a wet etching process, as shown in FIG. 20. The recessing of the high-k metal gate stacks 152 exposes a top portion of the gate spacer 134. Subsequently, a material layer 160 is deposited covering the high-k metal gate stacks 152 and the top portion of the gate spacer 134, as shown in FIG. 21. In the illustrated embodiment, the material layer 160 includes silicon nitride. The material layer 160 may be formed by one or more deposition techniques, such as CVD, PVD, PECVD, and ALD. One or more CMP processes may then be performed to planarize the device 100 and expose a top surface of the ILD layer 140, thereby forming plugs 160' over each high-k metal gate stack 152, as shown in FIG. 22.

Figures 23A, 23B:
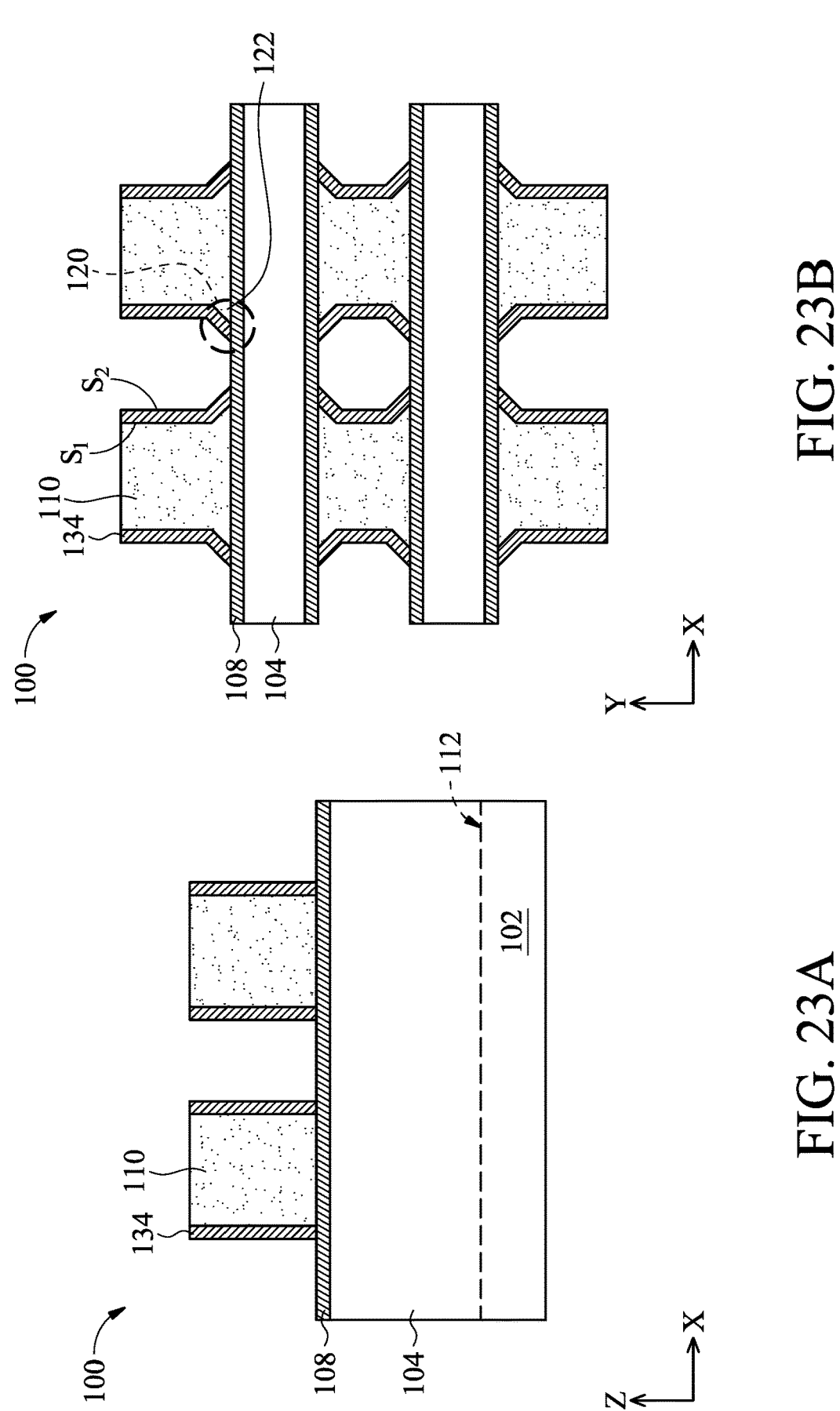

Referring to FIG. 2C, in an alternative embodiment of operation 214, step 214a' may first form the gate spacer 134 on sidewalls of the mandrel patterns 110 before forming dummy gates in openings therebetween, as shown in FIGS. 23A and 23B. The materials and forming of the gate spacer 134 are similar to what has been discussed above with reference to step 214c (FIG. 2B). Compared with the gate spacer 134 in FIGS. 14A and 14B, the gate spacer 134 in FIGS. 23A and 23B is deposited on the oxide layer 108. In the corner 120 of the footprint profile, the gate spacer 134 covers the residual 122 of the mandrel patterns 110. In other words, the gate spacer 134 can be considered as having a sidewall S₁ facing the dummy gate 130 and another sidewall S₂ opposing the sidewall S₁, with bottom portions of both sidewalls S₁ and S₂ tilted inwardly towards the opening where the dummy gates 130 are to be formed.

Figures 24A, 24B:
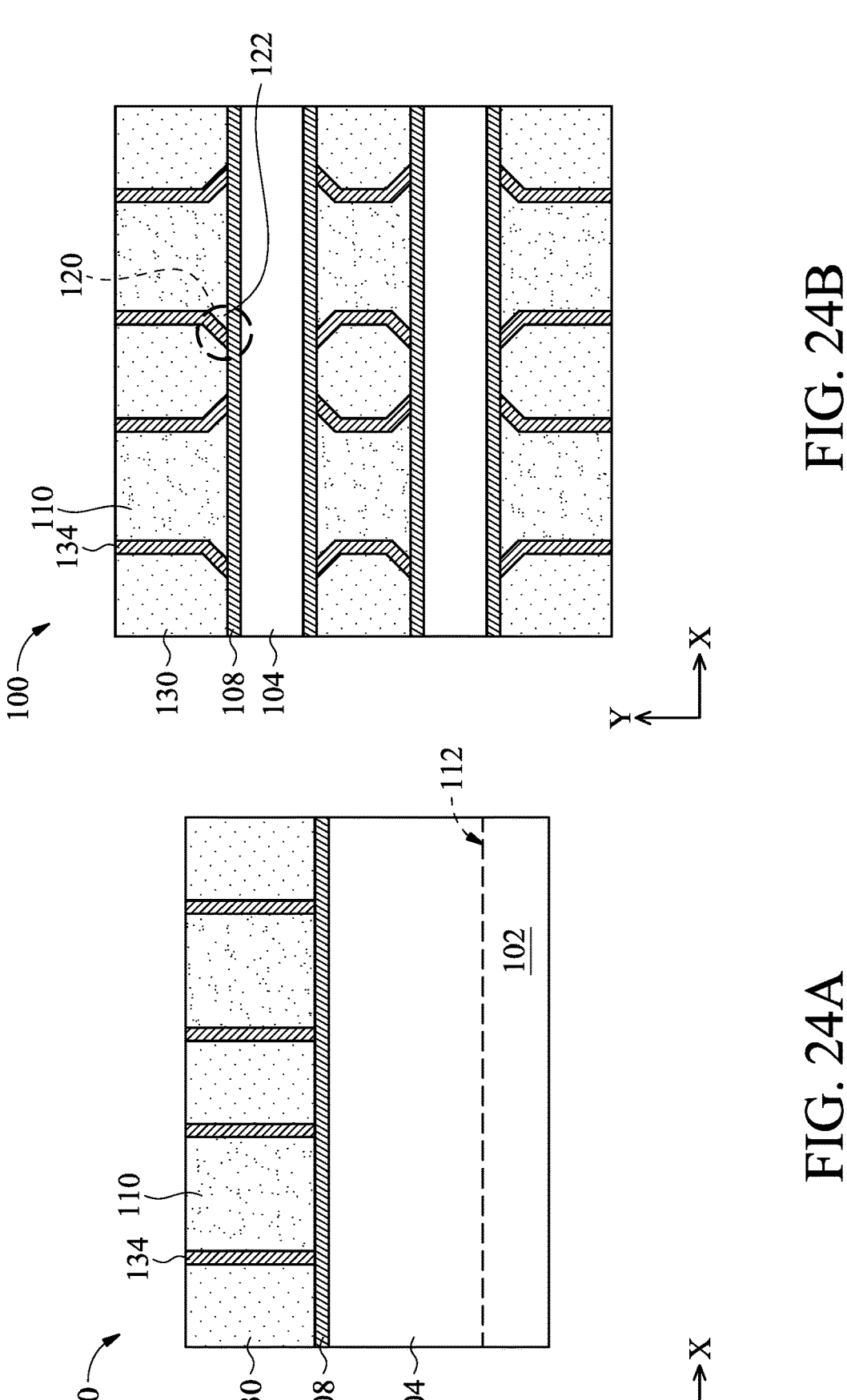
Figures 25A, 25B:
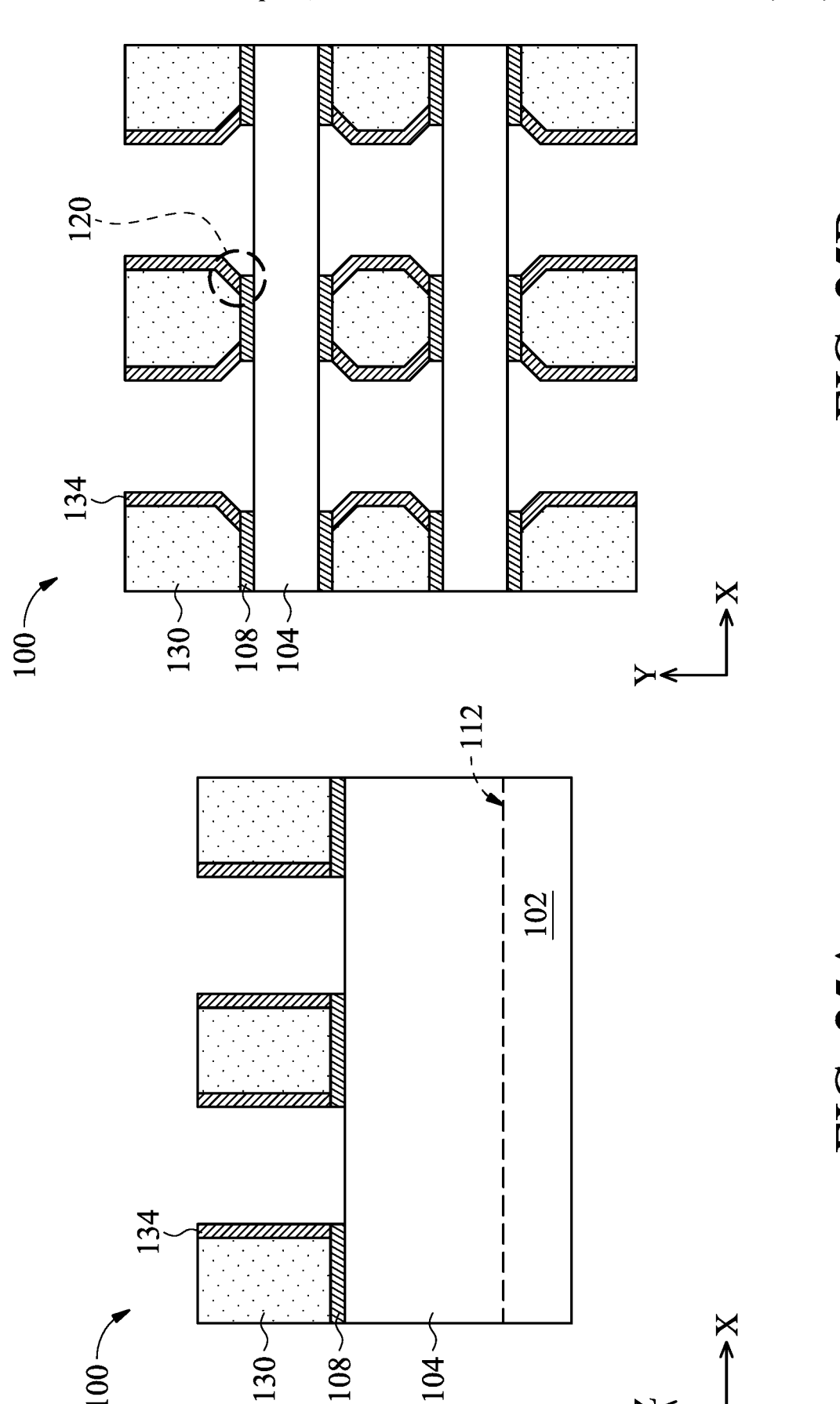
Figure 26:
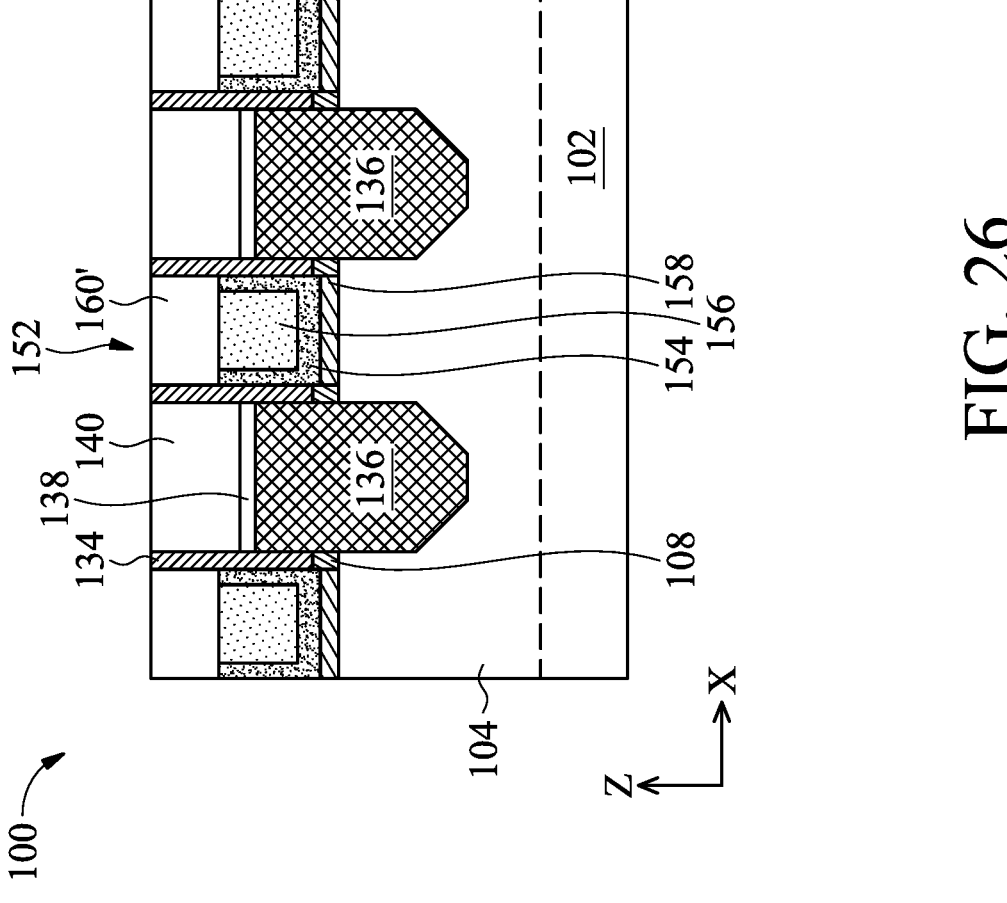

Then, step 214b' forms dummy gates 130 between opposing sidewalls of the gate spacer 134, as shown in FIGS. 24A and 24B. The materials and forming of the dummy gates 130 are similar to what has been discussed above with reference to step 214a (FIB. 2B). In the corner 120 of the footprint profile, the dummy gates 130 has a sidewall tilted inwardly into the dummy gate 130. Subsequently, step 214c' removes the mandrel patterns 110 in a selective etching process, which is similar to what has been discussed above with reference to step 214b (FIG. 2B). Step 214c' also removes portions of the oxide layer 108 under the mandrel patterns 110. The resulting device 100 after step 214c' is shown in FIGS. 25A and 25B. Compared with FIGS. 14A and 14B, in the alternative embodiment of operation 214, in the corner 120, sidewalls of the dummy gate 130 and both sidewalls of the gate spacer 134 have the notching profile. A portion of the oxide layer 108 also remains directly under the gate spacer 134, extending from one sidewall of the gate spacer 134 to another. The spatial relationship between the oxide layer 108 and the gate spacer 134 is also depicted in FIG. 26, illustrating the device 100 after the method 200 has proceeded through operations 216, 218, and 220 similar to what have been discussed above.

Although not intended to be limiting, one or more embodiments of the present disclosure provide many benefits to a semiconductor device and the formation thereof. For example, embodiments of the present disclosure provide a high aspect ratio gate structure and a gate fabrication technique that mitigate gate collapsing risks and includes a notching profile at footprint that reduces effective gate stack CDs and enlarges distance from a base of a gate stack to other FETs features, therefore mitigating possible shorting caused by metal gate protrusion and increasing a chip yield rate. Furthermore, the high aspect ratio gate structure formation method can be easily integrated into existing semiconductor fabrication processes.

In one exemplary aspect, the present disclosure is directed to a method. The method includes providing a substrate; forming mandrel patterns over the substrate; forming sacrificial patterns in openings between the mandrel patterns; removing the mandrel patterns; forming a dielectric layer in openings between the sacrificial patterns; removing the sacrificial patterns, resulting in a plurality of trenches; and forming a gate stack in each of the plurality of trenches. In some embodiments, the method further includes after the removing of the mandrel patterns, forming a spacer layer on sidewalls of the sacrificial patterns. In some embodiments, the method further includes prior to the forming of the sacrificial patterns, forming a spacer layer on sidewalls of the mandrel patterns. In some embodiments, the method further includes prior to the forming of the mandrel patterns, forming an oxide layer on the substrate. In some embodiments, the substrate includes a fin feature, and the mandrel patterns are deposited on the fin feature. In some embodiments, the method further includes prior to the forming of the dielectric layer, forming source/drain features in the openings of the sacrificial patterns, wherein the dielectric layer is deposited on the source/drain features. In some embodiments, the mandrel patterns and the sacrificial patterns include different material compositions, and wherein the removing of the mandrel patterns includes a selective etching process. In some embodiments, mandrel patterns include polysilicon and the sacrificial patterns include silicon nitride. In some embodiments, the forming of the sacrificial patterns includes depositing a sacrificial layer covering the mandrel patterns; and performing a planarization process to recess the sacrificial layer and expose the mandrel patterns, thereby resulting in the sacrificial patterns. In some embodiments, a footprint profile of the gate stack has a notch. In some embodiments, the gate stack includes a high-k dielectric layer, and wherein a bottom portion of the high-k dielectric layer has a notch.

In another exemplary aspect, the present disclosure is directed to a method. The method includes providing a structure having a semiconductor substrate and a fin protruding from the semiconductor substrate; forming at least two mandrels on the fin, the at least two mandrels spacing from each other; depositing a dummy gate between the at least two mandrels; removing the at least two mandrels, thereby exposing sidewalls of the dummy gate; forming a spacer on the sidewalls of the dummy gate; removing the dummy gate, thereby forming a gate trench exposing the fin; and forming a gate stack in the gate trench, the gate stack engaging the fin. In some embodiments, a spacing between the at least two mandrels is narrower than a width of the at least two mandrels. In some embodiments, a bottommost portion of the sidewalls of the dummy gate tilts inwardly towards the dummy gate. In some embodiments, a bottommost portion of a sidewall of the spacer tilts outwardly away from the dummy gate. In some embodiments, the method further includes prior to the removing of the dummy gate, forming source/drain features on both sides of the dummy gate. In some embodiments, the method further includes recessing the gate stack, exposing a top portion of the spacer; and forming a contact layer covering the gate stack and the top portion of the spacer.

In yet another exemplary aspect, the present disclosure is directed to a semiconductor device. The semiconductor device includes a semiconductor substrate; a fin protruding from the semiconductor substrate; a gate stack over and engaging the fin; and a spacer on sidewalls of the gate stack, wherein a bottom portion of the sidewalls of the gate stack tilts inwardly towards the gate stack. In some embodiments, the spacer has a first sidewall facing the gate stack and a second sidewall opposing the first sidewall, a bottom portion of the second sidewall of the spacer tilting outwardly away from the first sidewall. In some embodiments, the semiconductor device further includes an oxide layer directly under the spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a fin over a substrate, the fin extending lengthwise along a first direction;
forming an isolation structure on the substrate, wherein the fin extending upwardly through the isolation structure;
forming first and second mandrel patterns over the fin, each of the first and second mandrel patterns extending lengthwise along a second direction perpendicular to the first direction;
depositing a sacrificial feature between the first and second mandrel patterns, the sacrificial feature extending lengthwise along the second direction;
removing the first and second mandrel patterns to form first and second trenches, respectively, wherein the removing of the first and second mandrel patterns exposes the fin in the first and second trenches;
forming a spacer layer over sidewalls of the sacrificial feature;
forming a source region and a drain region of a transistor in the first and second trenches, respectively;
removing the sacrificial feature to form a third trench; and
forming a gate stack in the third trench, wherein after the gate stack is formed the spacer layer is disposed between the gate stack and the source and drain regions.

2. The method of claim 1, wherein the forming of the spacer layer is after the depositing of the sacrificial feature.

3. The method of claim 1, wherein the forming of the spacer layer is after the forming of the first and second mandrel patterns and prior to the depositing of the sacrificial feature.

4. The method of claim 1, further comprising:
depositing an oxide layer on sidewalls of the fin, wherein in a cross section along a top surface of the isolation structure the oxide layer separates the first and second mandrel patterns from the sidewalls of the fin.

5. The method of claim 4, wherein in the cross section the oxide layer separates the sacrificial feature from the sidewalls of the fin.

6. The method of claim 4, wherein after the removing of the sacrificial feature, the oxide layer is completely removed.

7. The method of claim 4, wherein after the forming of the gate stack, a portion of the oxide layer remains between the spacer layer and the fin.

8. The method of claim 1, wherein in a cross section along a top surface of the isolation structure, each of the first and second mandrel patterns includes a first portion in proximity to a sidewall of the fin and a second portion in distal to the sidewall of the fin, the first portion has a first width, and the second portion has a second width that is smaller than the first width.

9. The method of claim 1, wherein in a cross section along a top surface of the isolation structure, the gate stack includes a first portion in proximity to a sidewall of the fin and a second portion in distal to the sidewall of the fin, the first portion has a first width, and the second portion has a second width that is larger than the first width.

10. The method of claim 1, wherein the sacrificial feature is a dielectric layer.

11. A method, comprising:
forming a fin over a substrate;
depositing a mandrel layer over the fin;
patterning the mandrel layer to form a first mandrel and a second mandrel across the fin, wherein in a cross section parallel to a top surface of the substrate and through a middle portion of the fin, each of the first mandrel and the second mandrel has a first width in proximity to the fin and a second width distal to the fin, and the second width is smaller than the first width;
forming a sacrificial feature between the first mandrel and the second mandrel, wherein in the cross section, the sacrificial feature has a third width in proximity to the fin and a fourth width distal to the fin, and the fourth width is larger than the third width;
removing the first mandrel and the second mandrel to form a first trench;
depositing a dielectric layer in the first trench;
removing the sacrificial feature to form a second trench; and
forming a metal gate stack in the second trench.

12. The method of claim 11, wherein in the cross section, the metal gate stack has a fifth width in proximity to the fin and a sixth width distal to the fin, and the sixth width is larger than the fifth width.

13. The method of claim 11, further comprising:
prior to the depositing of the dielectric layer, forming an epitaxial feature in the first trench and under the dielectric layer.

14. The method of claim 11, further comprising:
prior to the forming of the sacrificial feature, depositing a spacer layer on sidewalls of the first mandrel and the second mandrel.

15. The method of claim 11, further comprising:
after the removing of the first mandrel and the second mandrel, depositing a spacer layer on sidewalls of the sacrificial feature.

16. The method of claim 15, wherein in the cross section, the spacer layer has a fifth width in proximity to the fin and a sixth width distal to the fin, and the sixth width is smaller than the fifth width.

17. A method, comprising:

providing a structure having a substrate and a fin protruding from the substrate;

forming mandrel patterns over the fin, wherein the mandrel patterns include a first footprint that has a protruding profile;

depositing dummy gates in openings between the mandrel patterns, wherein the dummy gates include a second footprint that has a notch profile;

removing the mandrel patterns to form trenches;

growing epitaxial features in the trenches; and replacing the dummy gates with metal gate stacks.

18. The method of claim 17, wherein the metal gate stacks inherit the second footprint that has the notch profile.

19. The method of claim 17, further comprising:

depositing a gate spacer layer prior to the depositing of the dummy gates.

20. The method of claim 19, further comprising:

prior to the forming of the mandrel patterns, forming an oxide layer over the fin, wherein a portion of the oxide layer is directly under the gate spacer layer.

\* \* \* \* \*